(12) United States Patent
Kim et al.

(10) Patent No.: US 12,266,282 B2
(45) Date of Patent: Apr. 1, 2025

(54) DISPLAY DEVICE

(71) Applicant: LG Display Co., Ltd., Seoul (KR)

(72) Inventors: Deokhwan Kim, Paju-si (KR); Beom Jeong, Paju-si (KR)

(73) Assignee: LG Display Co., Ltd. (KR)

( * ) Notice: Subject to any disclaimer, the term of this patent is extended or adjusted under 35 U.S.C. 154(b) by 0 days.

(21) Appl. No.: 18/390,647

(22) Filed: Dec. 20, 2023

(65) Prior Publication Data

US 2024/0212545 A1    Jun. 27, 2024

(30) Foreign Application Priority Data

Dec. 21, 2022  (KR) ......................... 10-2022-0180565

(51) Int. Cl.
*G09G 3/00*    (2006.01)
*G09G 3/3233*  (2016.01)
(Continued)

(52) U.S. Cl.
CPC ........... *G09G 3/035* (2020.08); *G09G 3/3233* (2013.01); *G09G 3/3266* (2013.01);
(Continued)

(58) Field of Classification Search
CPC .... G09G 3/035; G09G 3/3233; G09G 3/3266; G09G 2300/0413; G09G 2300/0819; G09G 2300/0842; G09G 2300/0861; G09G 2310/08; G09G 2320/0247; G09G 2330/021; H10K 59/131; H10K 59/88; H10K 59/87; H10K 77/111; H10K 2102/302; H10K 2102/311; H10K 59/12; H10K 59/871; B32B 15/20; B32B 23/00; B32B 27/08; B32B 27/281; B32B 27/286; B32B 27/302; B32B 27/304; B32B 27/308; B32B 27/365; B32B 3/02; B32B 9/00; B32B 9/04; B32B 9/041; B32B 9/045;
(Continued)

(56) References Cited

U.S. PATENT DOCUMENTS

2006/0109394 A1  5/2006  Miyagawa et al.
2020/0295114 A1  9/2020  Moon et al.
(Continued)

FOREIGN PATENT DOCUMENTS

KR    2016-0007745 A    1/2016
KR    10-2020-0110491 A    9/2020

OTHER PUBLICATIONS

Search report issued by the European Patent Office dated Mar. 11, 2024 issued in Patent Application No. 23219175.9 (11 pages).

*Primary Examiner* — Nelson M Rosario
(74) *Attorney, Agent, or Firm* — Fish & Richardson P.C.

(57) ABSTRACT

A display device includes a main region, a bending region which is bent from the main region in a thickness direction of a substrate, a sub-region which is connected to the bending region and faces the main region; and a plurality of wirings configured to extend from the sub-region through the bending region to the main region. The plurality of wirings includes: a first wiring to which a first voltage is applied; a second wiring to which a second voltage is applied; and a dummy wiring which receives a third voltage and is between the first wiring and the second wiring. The second voltage is higher than the first voltage, and the third voltage is less than the first voltage.

19 Claims, 24 Drawing Sheets

(51) Int. Cl.
  *G09G 3/3266* (2016.01)
  *H10K 59/131* (2023.01)
  *H10K 59/88* (2023.01)

(52) U.S. Cl.
  CPC ........... *H10K 59/131* (2023.02); *H10K 59/88* (2023.02); *G09G 2300/0413* (2013.01); *G09G 2300/0819* (2013.01); *G09G 2300/0842* (2013.01); *G09G 2300/0861* (2013.01); *G09G 2310/08* (2013.01); *G09G 2320/0247* (2013.01); *G09G 2330/021* (2013.01)

(58) Field of Classification Search
  CPC ............ B32B 2255/10; B32B 2255/20; B32B 2255/24; B32B 2307/202; B32B 2307/206; B32B 2307/412; B32B 2307/546; B32B 2307/7244; B32B 2307/7265; B32B 2457/20
  See application file for complete search history.

(56) References Cited

U.S. PATENT DOCUMENTS

2020/0312206 A1    10/2020  Eom et al.
2021/0066432 A1*  3/2021  Lim ..................... H10K 50/844

\* cited by examiner

DISPLAY DEVICE

CROSS-REFERENCE TO RELATED APPLICATION

The present application claims the priority of Korean Patent Application No. 10-2022-0180565, filed on Dec. 21, 2022, which is hereby incorporated by reference in its entirety.

BACKGROUND

Field of the Disclosure

The present disclosure relates to a display device.

Description of the Background

With the development of the information society, various demands for a display device for displaying images are increasing. Various types of display devices such as a liquid crystal display, an organic light emitting diode display, etc., are being used.

An image which is displayed on the display device may be a still image or a moving image. The moving image may have various types such as a sports video, a game video, and a movie. The display device is driven in a variable refresh rate (VRR) mode in which a driving frequency is varied according to the type of image, thereby reducing power consumption and increasing the lifespan of the display device.

When a pixel circuit is driven at various refresh rates by applying the variable refresh rate mode, a luminance difference may occur between the pixel circuits due to different refresh rates, so that quality degradation such as image distortion, flicker, etc., may occur.

SUMMARY

Accordingly, the present disclosure is directed to a display device that substantially obviates one or more of problems due to limitations and disadvantages described above.

More specifically, the present disclosure is to provide a display device capable of preventing the occurrence of cracks in a bent portion in a flexible display device.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

To achieve these and other advantages and in accordance with the present disclosure, as embodied and broadly described, a display device includes a main region, a bending region which is bent from the main region in a thickness direction of a substrate; a sub-region which is connected to the bending region and faces the main region; and a plurality of wirings configured to extend from the sub-region through the bending region to the main region, the plurality of wirings includes a first wiring to which a first voltage is applied; a second wiring to which a second voltage is applied; and a dummy wiring which receives a third voltage and is between the first wiring and the second wiring, and the second voltage is higher than the first voltage, and the third voltage is less than the first voltage.

In another aspect of the present disclosure, a display device includes a main region; a bending region which is bent from the main region in a thickness direction of a substrate, a sub-region which is connected to the bending region and faces the main region; and a plurality of wirings configured to extend from the sub-region through the bending region to the main region, the plurality of wirings includes a first wiring; a second wiring; and a dummy wiring between the first wiring and the second wiring, the substrate includes a first substrate portion overlapping the first wiring, a second substrate portion overlapping the second wiring, and a third substrate portion overlapping the dummy wiring, and physical properties of the first substrate portion, the second substrate portion, and the third substrate portion are different from one another.

According to various aspects of the present disclosure, the occurrence of cracks in the bent portion of a flexible display device can be prevented.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

Figure 1:
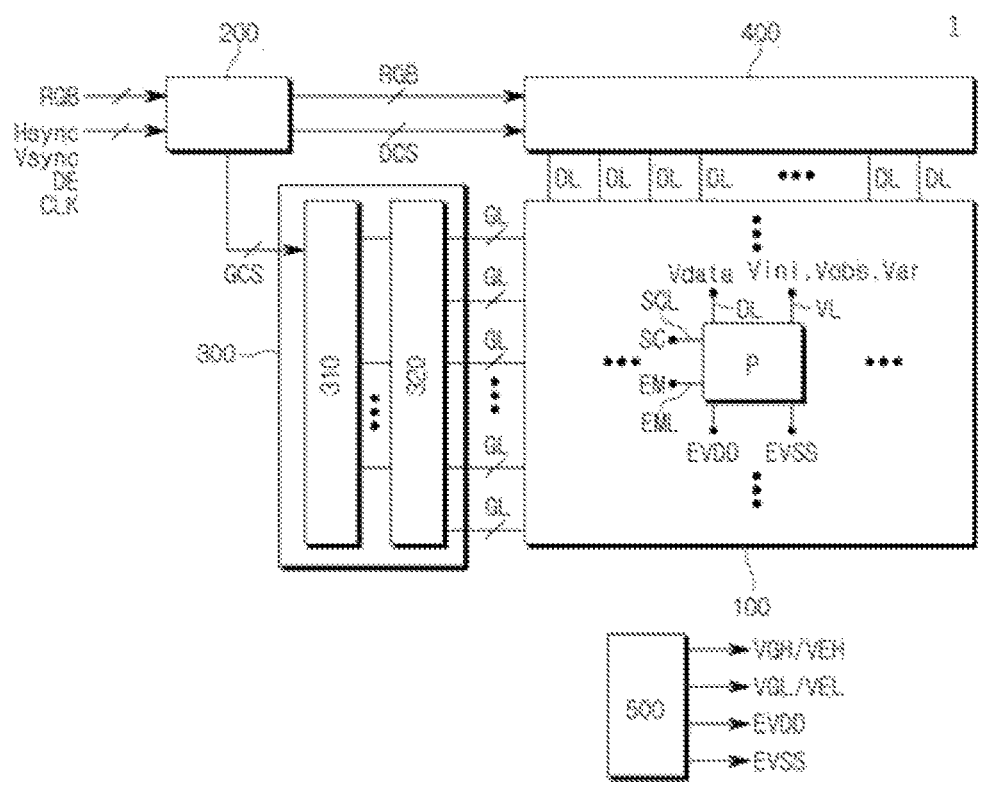
FIG. 1 is a block diagram showing schematically a display device according to an aspect of the present disclosure.

Hereinafter, aspects of the present disclosure will be described with reference to the accompanying drawings. In this specification, when it is mentioned that a component (or region, layer, portion) "is on," "is connected to," or "is combined with" another component, terms "is on," "connected to," or "combined with" mean that a component may be directly connected to/combined with another component or mean that a third component may be disposed between them.

The same reference numerals correspond to the same components. Also, in the drawings, the thicknesses, ratios, and dimensions of the components are exaggerated for effective description of the technical details. A term "and/or" includes all of one or more combinations that related configurations may define.

While terms such as the first and the second, etc., may be used to describe various components, the components are not limited by the terms mentioned above. The terms are used only for distinguishing between one component and other components. For example, the first component may be designated as the second component without departing from the scope of rights of various aspects. Similarly, the second component may be designated as the first component. An expression of a singular form includes the expression of plural form thereof unless otherwise explicitly mentioned in the context.

Terms such as "below," "lower," "above," "upper" and the like are used to describe the relationships between the components shown in the drawings. These terms have relative concepts and are described based on directions indicated in the drawings.

In the present specification, it should be understood that the term "include" or "comprise" and the like is intended to specify characteristics, numbers, steps, operations, components, parts or any combination thereof, and intended not to previously exclude the possibility of existence or addition of at least one another characteristics, numbers, steps, operations, components, parts or any combination thereof.

FIG. 1 is a block diagram showing schematically a display device according to an aspect of the present disclosure.

Referring to FIG. 1, a display device 1 includes a display panel 100 including a plurality of pixels P, a controller 200, a gate driver 300 which provides a gate signal to each of the plurality of pixels P, a data driver 400 which provides a data signal to each of the plurality of pixels P, and a power supply 500 which supplies power required to drive the pixel to each of the plurality of pixels P.

Figure 2:
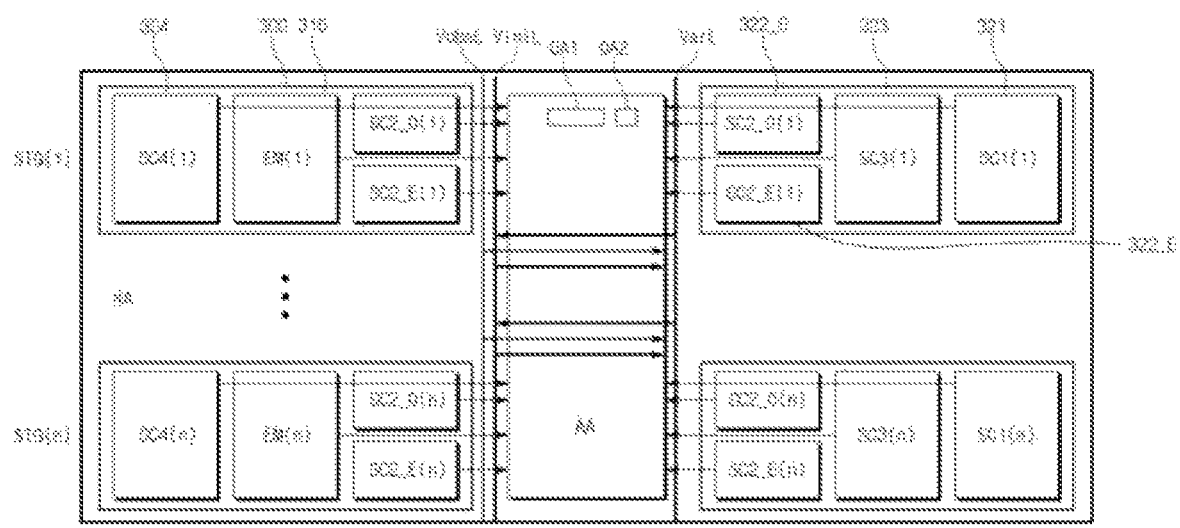
FIG. 2 is a view showing a configuration of a gate driver in the display device according to the aspect of the present disclosure.

The display panel 100 includes a display area AA (see FIG. 2) and a non-display area NA (see FIG. 2). The pixels P are located in the display area AA. The non-display area NA is disposed to surround the display area AA. The gate driver 300 and the data driver 400 are disposed in the non-display area NA.

In the display panel 100, a plurality of gate lines GL and a plurality of data lines DL cross each other, and each of the plurality of pixels P is connected to the gate line GL and the data line DL. Specifically, one pixel P receives the gate signal from the gate driver 300 through the gate line GL, receives the data signal from the data driver 400 through the data line DL, and receives a high potential driving voltage EVDD and a low potential driving voltage EVSS from the power supply 500.

Here, the gate line GL provides a scan signal SC and an emission control signal EM, and the data line DL provides a data voltage Vdata. Also, according to various aspects, the gate line GL may include a plurality of scan lines SCL for providing the scan signal SC and an emission control signal line EML for providing the emission control signal EM. In addition, the plurality of pixels P may additionally include a power line VL and may receive a bias voltage Vobs and an initialization voltages Var and Vini.

Also, each of the pixels P includes, as shown in FIG. 2, a light emitting element EL and a pixel circuit that controls the driving of the light emitting element EL. Here, the light emitting element EL includes an anode electrode, a cathode electrode, and a light emitting layer between the anode electrode and the cathode electrode.

The pixel circuit includes a plurality of switching elements, a driving element, and a capacitor. Here, the switching element and the driving element may be composed of thin film transistors. In the pixel circuit, the driving element controls the amount of light emission of the light emitting element EL by controlling the amount of current supplied to the light emitting element EL in accordance with the data voltage. Also, the plurality of switching elements operate the pixel circuit by receiving the scan signal SC supplied through the plurality of scan lines SCL and the emission control signal EM supplied through the emission control line EML.

The display panel 100 may be implemented as a non-transmissive display panel or a transmissive display panel. The transmissive display panel may be applied to a transparent display device in which an image is displayed on a screen and a real object in the background is visible. The display panel 100 may be manufactured as a flexible display panel. The flexible display panel may be implemented by an OLED panel using a plastic substrate.

Each of the pixels P may be divided into a red pixel, a green pixel, and a blue pixel for color implementation. Each of the pixels P may further include a white pixel. Each of the pixels P includes a pixel circuit.

Touch sensors may be disposed on the display panel 100. A touch input may be sensed by using separate touch sensors or may be sensed through the pixels P. The touch sensors may be implemented as in-cell type touch sensors which are on-cell type or add-on type and are disposed on the screen of the display panel or are embedded in the display panel 100.

The controller 200 processes image data RGB input from the outside appropriately for the size and resolution of the display panel 100 and supplies to the data driver 400. The controller 200 generates a gate control signal GCS and a data control signal DCS by using synchronization signals input from the outside, for example, a dot clock signal CLK, a data enable signal DE, a horizontal synchronization signal Hsync, and a vertical synchronization signal Vsync. The generated gate control signal GCS and data control signal DCS are provided to the gate driver 300 and the data driver 400 respectively, so that the gate driver 300 and the data driver 400 are controlled.

The controller 200 may be configured by being coupled to various processors, for example, a microprocessor, a mobile processor, an application processor, etc., depending on a device to be mounted thereon.

A host system may be any one of a television (TV) system, a set top box, a navigation system, a personal computer (PC), a home theater system, a mobile device, a wearable device, and a vehicle system.

The controller 200 may multiply an input frame frequency by "i" and may control the operation timing of a display panel driver at a frame frequency of input frame frequency× "i" ("i" is a positive integer greater than 0) Hz. The input frame frequency is 60 Hz in National Television Standards Committee (NTSC) method and is 50 Hz in Phase-Alternating Line (PAL) method.

The controller 200 generates a signal such that the pixel P may be driven at various refresh rates. That is, the controller 200 generates signals related to the driving such that the pixel P is driven in a variable refresh rate (VRR) mode or in a switchable manner between a first refresh rate and a second refresh rate. For example, the controller 200 may drive the pixel P at various refresh rates by simply changing the speed of a clock signal, by generating a synchronization signal and creating a horizontal blank or a vertical blank, or by driving the gate driver 300 in a mask manner.

The controller 200 generates the gate control signal GCS for controlling the operation timing of the gate driver 300 and the data control signal DCS for controlling the operation timing of the data driver 400, on the basis of the timing signals Vsync, Hsync, and DE received from the host system. The controller 200 synchronizes the gate driver 300 and the data driver 400 by controlling the operation timing of the display panel driver.

A voltage level of the gate control signal GCS output from the controller 200 may be converted into gate-on voltages VGL and VEL and gate-off voltages VGH and VEH through a level shifter (not shown), and be supplied to the gate driver 300. The level shifter converts a low-level voltage of the gate control signal GCS into the gate low voltage VGL and converts a high-level voltage of the gate control signal GCS into the gate high voltage VGH. The gate control signal GCS includes a start pulse and a shift clock.

The gate driver 300 provides a scan signal SC to the gate line GL in accordance with the gate control signal GCS provided from the controller 200. The gate driver 300 may be disposed on one side or both sides of the display panel 100 in a Gate-In-Panel (GIP) manner.

The gate driver 300 sequentially outputs the gate signal to the plurality of gate lines GL under the control of the controller 200. The gate driver 300 may sequentially provide the gate signals to the gate lines GL by shifting the gate signals by using a shift register.

The gate signal may include an emission control signal EM and the scan signal SC in an organic light emitting display device. The scan signal SC includes a scan pulse which swings between the gate-on voltage VGL and the gate-off voltage VGH. The emission control signal EM may include an emission control signal pulse which swings between the gate-on voltage VEL and the gate-off voltage VEH.

The scan pulse is synchronized with the data voltage Vdata and selects the pixels P of a line where data is to be written. The emission control signal EM defines an emission time of the pixels P.

The gate driver 300 may include an emission control signal driver 310 and at least one scan driver 320.

The emission control signal driver 310 outputs the emission control signal pulse in response to the start pulse and the shift clock from the controller 200 and sequentially shifts the emission control signal pulses in accordance with the shift clock.

The at least one scan driver 320 outputs the scan pulse in response to the start pulse and the shift clock from the controller 200 and shifts the scan pulse in accordance with a shift clock timing.

The data driver 400 converts the image data RGB into the data voltage Vdata in accordance with the data control signal DCS provided from the controller 200, and provides the converted data voltage Vdata to the pixel P through the data line DL.

Although the data driver 400 is shown as being disposed on one side of the display panel 100 in one form in FIG. 1, the number and position of the data driver 400 are not limited thereto.

That is, the data driver 400 may be composed of a plurality of integrated circuits (ICs) and may disposed on one side of the display panel 100 as being divided into a plurality of pieces.

The power supply 500 generates DC power required for driving a pixel array of the display panel 100 and the display panel driver by using a DC-DC converter. The DC-DC converter may include a charge pump, a regulator, a buck converter, a boost converter, and the like. The power supply 500 receives a DC input voltage applied from the unshown host system and may generate the gate-on voltages VGL and VEL, the gate-off voltages VGH and VEH, the high potential driving voltage EVDD, the low potential driving voltage EVSS, etc. The gate-on voltages VGL and VEL and the gate-off voltages VGH and VEH are supplied to the level shifter (not shown) and the gate driver 300. The high potential driving voltage EVDD and the low potential driving voltage EVSS are commonly supplied to the pixels P.

FIG. 2 is a view showing a configuration of the gate driver in the display device according to the aspect of the present disclosure.

Referring to FIG. 2, the gate driver 300 includes the emission control signal driver 310 and the scan driver 320. The scan driver 320 may include first to fourth scan drivers 321, 322, 333, and 334. Also, the second scan driver 322 may include a second odd-numbered scan driver 322_O and a second even-numbered scan driver 322_E.

In the gate driver 300, the shift register may be configured symmetrically on both sides of the display area AA. Also, in the gate driver 300, the shift register on one side of the display area AA may include the second scan drivers 322_O and 322_E, the fourth scan driver 324, and the emission control signal driver 310, respectively. The shift register on the other side of the display area AA may include the first scan driver 321, the second scan drivers 322_O and 322_E, and the third scan driver 323, respectively. However, there is no limit to this. The emission control signal driver 310 and the first to fourth scan drivers 321, 322, 323, and 324 may be disposed differently according to the aspect.

Each of stages STG1 to STGn of the shift register may include first scan signal generators SC1(1) to SC1($n$), second scan signal generators SC2_O(1) to SC2_O(n) and SC2_E(1) to SC2_E(n), third scan signal generators SC3(1) to SC3($n$), fourth scan signal generators SC4(1) to SC4($n$), and emission control signal generators EM(1) to EM(n).

The first scan signal generators SC1(1) to SC1($n$) output first scan signals SC1(1) to SC1($n$) through first scan lines SCL1 of the display panel 100. The second scan signal generators SC2_O(1) to SC2_O(n) and SC2_E(1) to SC2_E(n) output second scan signals SC2(1) to SC2($n$) through second scan lines SCL2 of the display panel 100. The third scan signal generators SC3(1) to SC3($n$) output third scan signals SC3(1) to SC3($n$) through third scan lines SCL3 of the display panel 100. The fourth scan signal generators SC4(1) to SC4($n$) output fourth scan signals SC4(1) to SC4($n$) through fourth scan lines SCL4 of the display panel 100. The emission control signal generators EM(1) to EM(n) output the emission control signals EM(1) to EM(n) through the emission control lines EML of the display panel 100.

The first scan signals SC1(1) to SC1($n$) may be used as a signal for driving an A-th transistor (e.g., a compensation transistor, etc.) included in the pixel circuit. The second scan signals SC2(1) to SC2($n$) may be used as a signal for driving a B-th transistor (e.g., a data supply transistor, etc.) included in the pixel circuit. The third scan signals SC3(1) to SC3($n$) may be used as a signal for driving a C-th transistor (e.g., a bias transistor, etc.) included in the pixel circuit. The fourth scan signals SC4(1) to SC4($n$) may be used as a signal for driving a D-th transistor (e.g., an initialization transistor, etc.) included in the pixel circuit. The emission control signals EM(1) to EM(n) may be used as a signal for driving an E-th transistor (e.g., a light emission control transistor, etc.) included in the pixel circuit. For example, when the light emission control transistors of the pixels are controlled by using the emission control signals EM(1) to EM(n), an emission time of the light emitting element is varied.

Referring to FIG. 2, a bias voltage bus line VobsL, a first initialization voltage bus line VarL, and a second initialization voltage bus line ViniL may be disposed between the gate driver 300 and the display area AA.

The bias voltage bus line VobsL, the first initialization voltage bus line VarL, and the second initialization voltage bus line ViniL may supply the bias voltage Vobs, the first initialization voltage Var, and the second initialization voltage Vini from the power supply 500 to the pixel circuit, respectively.

In the drawing, even though the bias voltage bus line VobsL, the first initialization voltage bus line VarL, and the second initialization voltage bus line ViniL are shown as being positioned on only one side such as left or right side of the display area AA, respectively, they are limited thereto. They may be positioned on both sides, and the left or right position is not limited although they may be positioned on one side, the left or right position is not limited.

Referring to FIG. 2, one or more optical areas OA1 and OA2 may be disposed in the display area AA.

One or more optical areas OA1 and OA2 may be disposed to overlap one or more optical electronics. The optical electronics may include a photographing device such as a camera (an image sensor), etc., and a sensor such as a proximity sensor, an illuminance sensor, etc.

For the operation of the optical electronics, the one or more optical areas OA1 and OA2 may have a light-transmission structure and have a transmittance greater than a certain value. In other words, the number of pixels P per unit area in the one or more optical areas OA1 and OA2 may be less than the number of pixels P per unit area in general areas other than the optical areas OA1 and OA2 in the display area AA. That is, the resolution of the one or more optical areas OA1 and OA2 may be lower than that of the general area in the display area AA.

The light-transmission structure in the one or more optical area OA1 and OA2 may be formed by patterning the cathode electrode in a portion where the pixel P is not arranged. Here, the cathode electrode which is patterned may be removed by using laser, or the cathode electrode may be selectively formed and patterned by using a material such as a cathode deposition prevention layer.

Also, light-transmission structure in the one or more optical area OA1 and OA2 may be formed by separating the light emitting element EL and the pixel circuit in the pixel P. In other words, the light emitting element EL of the pixel P is located on the optical areas OA1 and OA2, and a plurality of the transistors TFT constituting the pixel circuit is disposed around the optical areas OA1 and OA2, so that the light emitting element EL and the pixel circuit may be electrically connected through a transparent metal layer.

Figure 3:
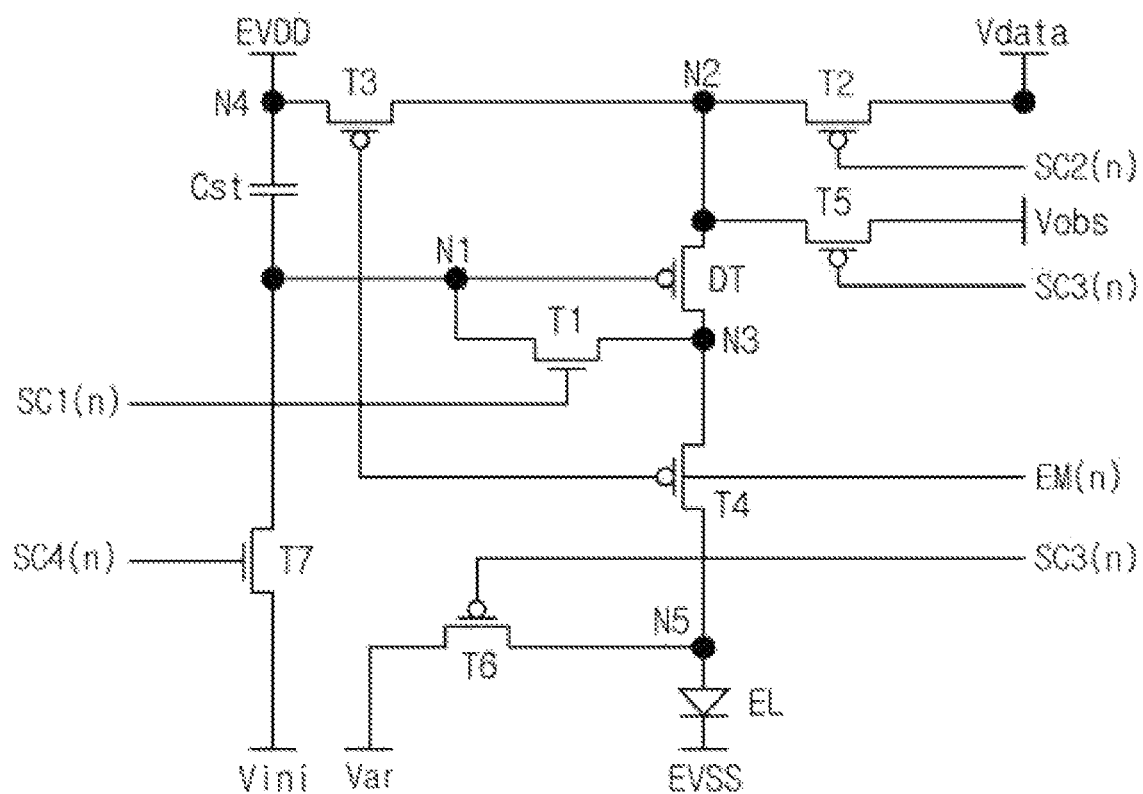
FIG. 3 is a view showing a pixel circuit in the display device according to the aspect of the present disclosure.

FIG. 3 is a view showing the pixel circuit in the display device according to the aspect of the present disclosure.

FIG. 3 merely shows the pixel circuit as an example for description, and any structure capable of controlling the light emission of the light emitting element EL by applying a light emission signal EM (n) may be used. For example, the pixel circuit may include an additional scan signal, a switching thin film transistor connected to the scan signal, and a switching thin film transistor to which an additional initialization voltage is applied. Connection relationships among the switching elements or connection positions of the capacitor may be made in various ways. Hereinafter, for convenience of description, the display device having the pixel circuit structure shown in FIG. 4 will be described.

Referring to FIG. 3, each of the plurality of pixels P may include the pixel circuit with a driving transistor DT and include the light emitting element EL connected to the pixel circuit.

The pixel circuit may drive the light emitting element EL by controlling a driving current flowing through the light emitting element EL. The pixel circuit may include the driving transistor DT, first to seventh transistors T1 to T7, and a capacitor Cst. Each of the transistors DT and T1 to T7 may include a first electrode, a second electrode, and a gate electrode. One of the first electrode and the second electrode may be a source electrode, and the other of the first electrode and the second electrode may be a drain electrode.

Each of the transistors DT and T1 to T7 may be a P-type thin film transistor or an N-type thin film transistor. In the aspect of FIG. 3, the first transistor T1 and the seventh transistor T7 are N-type thin film transistors, and the other transistors DT and T2 to T6 are P-type thin film transistors. However, the transistors are not limited thereto. All or some of the transistors DT and T1 to T7 may be P-type thin film transistors or N-type thin film transistors according to the aspect. Also, the N-type thin film transistor may be an oxide thin film transistor, and the P-type thin film transistor may be a polycrystalline silicon thin film transistor.

Hereinafter, an example is shown where the first transistor T1 and the seventh transistor T7 are N-type thin film transistors and the other transistors DT and T2 to T6 are P-type thin film transistors. Accordingly, the first transistor T1 and the seventh transistor T7 are turned on by being applied with a high voltage, and the other transistors DT and T2 to T6 are turned on by being applied with a low voltage.

According to the aspect, the first transistor T1 constituting the pixel circuit may function as a compensation transistor, the second transistor T2 may function as a data supply transistor, the third and fourth transistors T3 and T4 may function as a light emission control transistor, the fifth transistor T5 may function as a bias transistor, and the sixth and seventh transistors T6 and T7 may function as an initialization transistor.

The light emitting element EL may include the anode electrode and the cathode electrode. The anode electrode of the light emitting element EL may be connected to a fifth node N5, and the cathode electrode may be connected to the low potential driving voltage EVSS.

The driving transistor DT may include a first electrode connected to a second node N2, a second electrode connected to a third node N3, and the gate electrode connected to a first node N1. The driving transistor DT may provide a driving current Id to the light emitting element EL on the basis of a voltage of the first node N1 (or a data voltage stored in the capacitor Cst to be described later).

The first transistor T1 includes a first electrode connected to the first node N1, a second electrode connected to the third node N3, and the gate electrode that receives the first scan signal SC1 ($n$). The first transistor T1 is turned on in response to the first scan signal SC1 ($n$), and is diode-connected between the first node N1 and the third node N3, so that a threshold voltage Vth of the driving transistor DT may be sampled. The first transistor T1 may be a compensation transistor.

The capacitor Cst may be connected or formed between the first node N1 and a fourth node N4. The capacitor Cst may store or maintain the provided high potential driving voltage EVDD.

The second transistor T2 may include a first electrode connected to the data line DL (or receiving the data voltage Vdata), a second electrode connected to the second node N2, and a gate electrode that receives the second scan signal SC2($n$). The second transistor T2 is turned on in response to the second scan signal SC2($n$) and transmits the data voltage Vdata to the second node N2. The second transistor T2 may be a data supply transistor.

The third transistor T3 and the fourth transistor T4 (or first and second light emission control transistors) may be connected between the high potential driving voltage EVDD and the light emitting element EL, and may form a current moving path through which the driving current Id generated by the driving transistor DT moves.

The third transistor T3 includes a first electrode which is connected to the fourth node N4 and receives the high potential driving voltage EVDD, a second electrode connected to the second node N2, and a gate electrode that receives the emission control signal EM(n).

The fourth transistor T4 includes a first electrode connected to the third node N3, a second electrode connected to the fifth node N5 (or the anode electrode of the light emitting element EL), and a gate electrode that receives the emission control signal EM(n).

The third and fourth transistors T3 and T4 are turned on in response to the emission control signal EM(n). In this case, the driving current Id is supplied to the light emitting element EL, and the light emitting element EL may emit light with a luminance corresponding to the driving current Id.

The fifth transistor T5 includes a first electrode that receives the bias voltage Vobs, a second electrode connected to the second node N2, and a gate electrode that receives the third scan signal SC3($n$). The fifth transistor T5 may be a bias transistor.

The sixth transistor T6 may include a first electrode that receives the first initialization voltage Var, a second electrode connected to the fifth node N5, and a gate electrode that receives the third scan signal SC3($n$).

The sixth transistor T6 may be turned on in response to the third scan signal SC3 ($n$) before the light emitting element EL emits light (or after the light emitting element EL emits light), and may initialize the anode electrode (or pixel electrode) of the light emitting element EL by using the first initialization voltage Var. The light emitting element EL may have a parasitic capacitor formed between the anode electrode and the cathode electrode. Also, while the light emitting element EL emits light, the parasitic capacitor is charged so that the anode electrode of the light emitting element EL may have a specific voltage. Accordingly, the amount of charge accumulated in the light emitting element EL may be initialized by applying the first initialization voltage Var to the anode electrode of the light emitting element EL through the sixth transistor T6.

In the present disclosure, the gate electrodes of the fifth and sixth transistors T5 and T6 are configured to commonly receive the third scan signal SC3($n$) and are not necessarily limited thereto. The gate electrodes of the fifth and sixth transistors T5 and T6 may be configured to be independently controlled by receiving separate scan signals.

The seventh transistor T7 may include a first electrode that receives the second initialization voltage Vini, a second electrode connected to the first node N1, and a gate electrode that receives the fourth scan signal SC4($n$).

The seventh transistor T7 may be turned on in response to the fourth scan signal SC4 ($n$) and may initialize the gate electrode of the driving transistor DT by using the second initialization voltage Vini. Unnecessary charges may remain on the gate electrode of the driving transistor DT due to the high potential driving voltage EVDD stored in the capacitor Cst. Accordingly, the amount of remaining charge may be initialized by applying the second initialization voltage Vini to the gate electrode of the driving transistor DT through the seventh transistor T7.

Figure 4A:
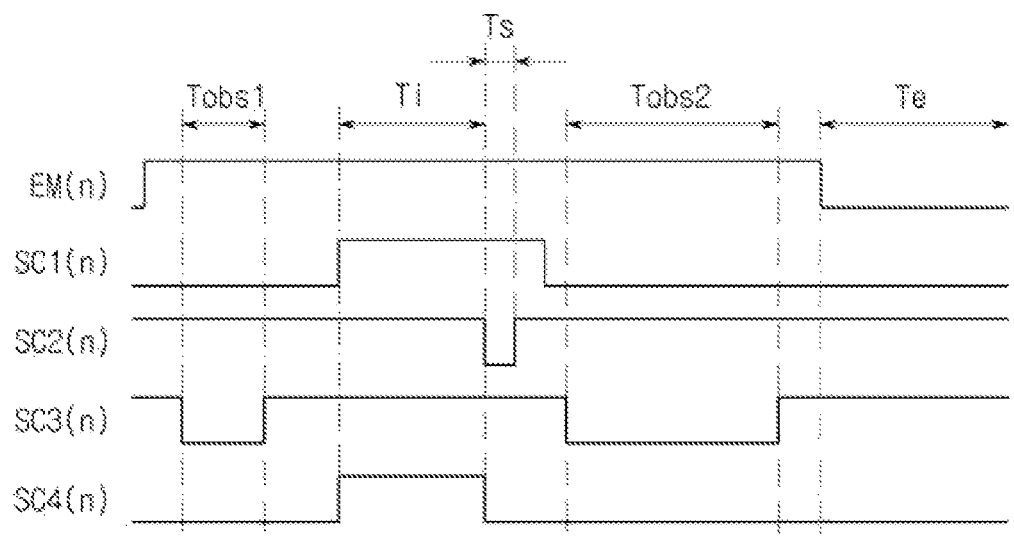
FIGS. 4A to 4C are views for describing operations of a scan signal and an emission control signal in a refresh period and a hold period in the pixel circuit shown in FIG. 3.
Figure 4B:
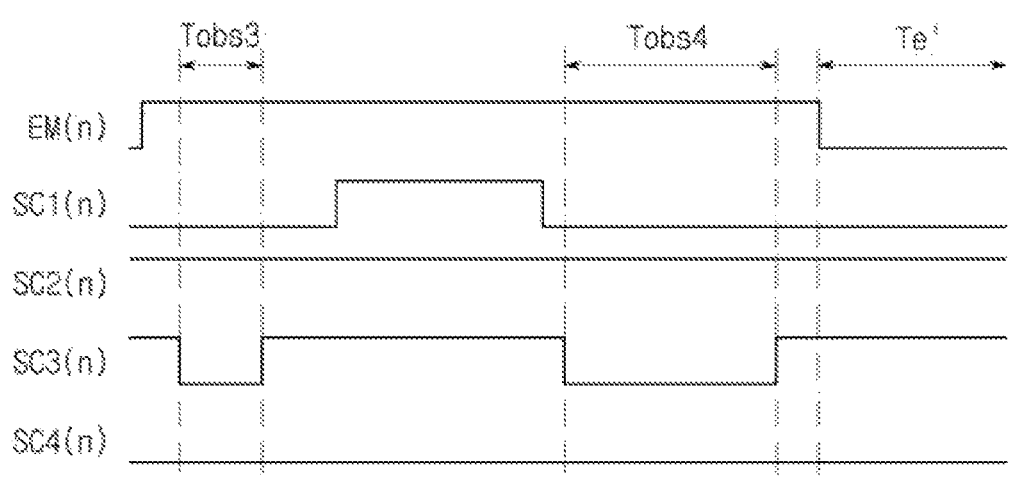
Figure 4C:
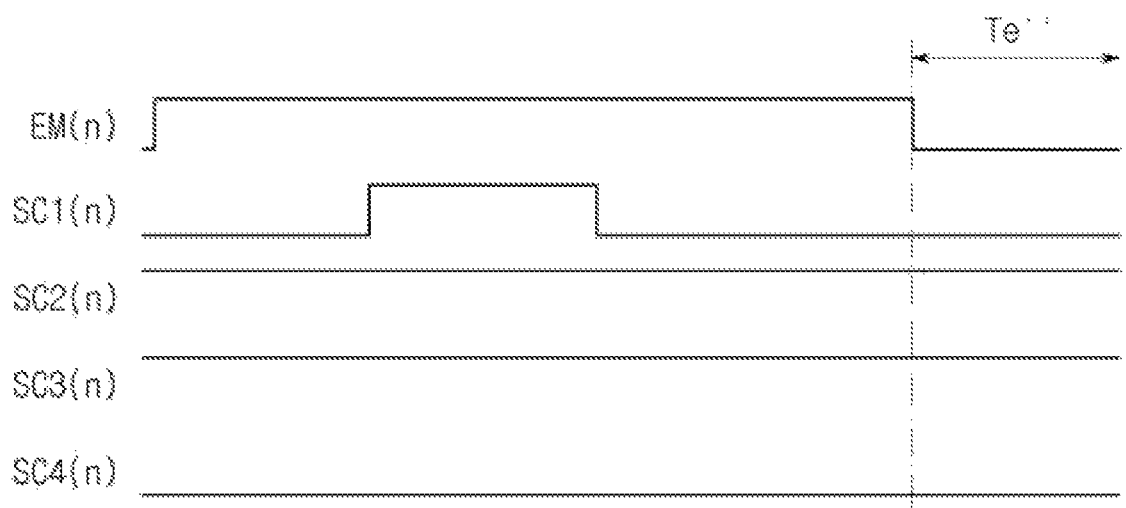

FIGS. 4A to 4C are views for describing operations of the scan signal and the emission control signal in a refresh period and a hold period in the pixel circuit shown in FIG. 3.

The display device according to the aspect of the present disclosure may operate as a variable refresh rate (VRR) mode display device. The VRR mode may drive the display device by increasing, at a point of time when high-speed driving is required, a refresh rate at which the data voltage Vdata is updated, while the display device is being driven at a constant frequency, or may drive a pixel by reducing the refresh rate at a point of time when it is necessary to reduce power consumption or when a low-speed driving is required.

Each of the plurality of pixels P may be driven through a combination of a refresh frame and a hold frame within one second. In the present disclosure, one set is defined as that a combination of a refresh period in which the data voltage Vdata is updated and a hold period in which the data voltage Vdata is not updated is repeated for one second. Also, one set period is a cycle in which the combination of the refresh period and the hold period is repeated.

When the refresh rate is 120 Hz, a period for the driving of the pixel may be composed of only the refresh period. That is, the refresh period may be repeated 120 times within one second. One refresh period is 1/120=8.33 ms, and one set period is also 8.33 ms.

When the refresh rate is 60 Hz, a period for the driving of the pixel may be composed of alternating the refresh period and the hold period. That is, the refresh period and the hold period may be alternately repeated 60 times each within one second. One refresh period and one hold period are 0.5/60=8.33 ms respectively, and one set period is 16.66 ms.

When the pixel is driven at the refresh rate of 1 Hz, one frame may be composed of one refresh period and 119 hold periods after the one refresh period. Also, when the pixel is driven at the refresh rate of 1 Hz, one frame may be composed of a plurality of refresh periods and a plurality of hold periods. Here, one refresh period and one hold period are 1/120=8.33 ms respectively, and one set period is 1s.

In the refresh period, a new data voltage Vdata is charged and applied to the driving transistor DT. In the hold period, the data voltage Vdata of the previous frame is maintained and used. Meanwhile, the hold period is also referred to as a skip period in that a process of applying a new data voltage Vdata to the driving transistor DT is omitted.

Each of the plurality of pixels P may initialize a voltage which is charged or remains in the pixel circuit during the refresh period. Specifically, each of the plurality of pixels P may remove the influence of the high potential driving voltage EVDD and the data voltage Vdata stored in the previous frame during the refresh period. Accordingly, each of the plurality of pixels P may display an image corresponding to the new data voltage Vdata in the hold period.

Each of the plurality of pixels P may display an image by supplying a driving current corresponding to the data voltage Vdata to the light emitting element EL during the hold period, and may maintain the turn-on state of the light emitting element EL.

First, the driving of the pixel circuit and the light emitting element in the refresh period of FIG. 4A will be described. The refresh period may include at least one of bias sections Tobs1 and Tobs2, an initialization period Ti, a sampling period Ts, and a light emission period Te. However, this is just an example and is not necessarily limited to this order.

Referring to FIG. 4A, the pixel circuit may operate including at least one of the bias sections Tobs1 and Tobs2 during the refresh period.

In the at least one of the bias sections Tobs1 and Tobs2, an on-bias stress OBS operation to which the bias voltage Vobs is applied is performed. Also, the emission control signal EM(n) is at a high voltage, and the third and fourth transistors T3 and T4 perform an off-operation. The first scan signal SC1($n$) and the fourth scan signal SC4($n$) are at a low voltage, and the first transistor T1 and the seventh transistor T7 perform an off-operation. The second scan signal SC2 is at a high voltage, and the second transistor T2 performs an off-operation.

The third scan signal SC3($n$) having a low voltage is input, and the fifth and sixth transistors T5 and T6 are turned on. As the fifth transistor T5 is turned on, the bias voltage Vobs is applied to the first electrode of the driving transistor DT connected to the second node N2.

Here, the bias voltage Vobs is supplied to the third node N3 that is the drain electrode of the driving transistor DT, so that a voltage charging time or charging delay of the fifth node N5 that is the anode electrode of the light emitting element EL may be reduced in the light emission period. The driving transistor DT maintains stronger saturation.

For example, as the bias voltage Vobs increases, the voltage of the third node N3 that is the drain electrode of the driving transistor DT may increase and a gate-source voltage or a drain-source voltage of the driving transistor DT may decrease. Therefore, the bias voltage Vobs may be higher than the data voltage Vdata.

Here, the magnitude of the drain-source current Id passing through the driving transistor DT may be reduced, and the stress of the driving transistor DT may be reduced in a positive bias stress condition, thereby eliminating the charging delay of the voltage of the third node N3. In other words, the on-bias stress OBS operation is performed before the threshold voltage Vth of the driving transistor DT is sampled, so that hysteresis of the driving transistor DT may be reduced.

Accordingly, the on-bias stress OBS operation in at least one of the bias sections Tobs1 and Tobs2 may be defined as an operation of directly applying an appropriate bias voltage to the driving transistor DT during non-light emission periods.

In addition, as the sixth transistor T6 is turned on in at least one of the bias sections Tobs1 and Tobs2, the anode electrode (or pixel electrode) of the light emitting element EL connected to the fifth node N5 is initialized to the first initialization voltage Var.

However, the gate electrodes of the fifth and sixth transistors T5 and T6 may receive separate scan signals and be independently controlled. That is, it is not required to simultaneously apply the bias voltage to the first electrode of the driving transistor DT and the anode electrode of the light emitting element EL in the bias section.

Referring to FIG. 4A, the pixel circuit may operate including the initialization period Ti during the refresh period. The voltage of the gate electrode of the driving transistor DT is initialized in the initialization period Ti.

The first scan signal SC1($n$) to the fourth scan signal SC4($n$) and the emission control signal EM(n) are at a high voltage, and the first transistor T1 and the seventh transistor T7 are turned on. The second to sixth transistors T2, T3, T4, T5, and T6 are turned off. As the first and seventh transistors T1 and T7 are turned on, the second electrode and the gate electrode of the driving transistor DT connected to the first node N1 are initialized to the second initialization voltage Vini.

Referring to FIG. 4A, the pixel circuit may operate including the sampling period Ts during the refresh period. The threshold voltage Vth of the driving transistor DT is sampled in the sampling period.

The first scan signal SC1 ($n$), the third scan signal SC3 ($n$), and the emission control signal EM ($n$) are at a high voltage, and the second scan signal SC2 ($n$) and the fourth scan signal SC4 ($n$) having a low voltage are input. Accordingly, the third to seventh transistors T3, T4, T5, T6, and T7 are turned off, the first transistor T1 remains in the on-state, and the second transistor T2 is turned on. That is, the second transistor T2 is turned on, the data voltage Vdata is applied to the driving transistor DT, and the first transistor T1 is diode-connected between the first node N1 and the third node N3, so that the threshold voltage Vth of the driving transistor DT may be sampled.

Referring to FIG. 4A, the pixel circuit may operate including the light emission period Te during the refresh period. In the light emission period Te, the sampled threshold voltage Vth is offset and the light emitting element EL emits light with a driving current corresponding to the sampled data voltage.

The emission control signal EM(n) is at a low voltage, and the third and fourth transistors T3 and T4 are turned on.

As the third transistor T3 is turned on, the high potential driving voltage EVDD connected to the fourth node N4 is applied to the first electrode of the driving transistor DT connected to the second node N2 through the third transistor T3. The driving current Id supplied from the driving transistor DT to the light emitting element EL via the fourth transistor T4 becomes irrelevant to the value of the threshold voltage Vth of the driving transistor DT, so that the threshold voltage Vth of the driving transistor DT is compensated and the driving transistor operates.

Next, referring to FIG. 4B, the driving of the pixel circuit and the light emitting element in the hold period will be described.

The hold period may include at least one of bias sections Tobs3 and Tobs4 and a light emission period Te'. The description of the same operation of the pixel circuit as the operation of the refresh period will be omitted.

As described above, in the refresh period, a new data voltage Vdata is charged and applied to the gate electrode of the driving transistor DT. Whereas, the hold period is different from the refresh period in that the data voltage Vdata in the refresh period is maintained and used. Therefore, unlike the refresh period, the hold period does not require the initialization period Ti and the sampling period Ts.

In the hold period, it may be enough as long as the on-bias stress OBS operation is performed even only one time. However, in the aspect, for convenience of the driving circuit, the third scan signal SC3 (n) in the hold period is driven in the same manner as the third scan signal SC3 (n) in the refresh period. This results in that the on-bias stress OBS operation may be performed twice, as in the refresh period.

A difference between the driving signal in the refresh period described with reference to FIG. 4A and the driving signal in the hold period in FIG. 4B results from the second and fourth scan signals SC2(n) and SC4(n). The hold period does not require the initialization period Ti and the sampling period Ts. Therefore, unlike the refresh period, the second scan signal SC2(n) is always at a high voltage, and the fourth scan signal SC4(n) is always at a low voltage. That is, the second and seventh transistors T2 and T7 are always turned off.

FIG. 4C shows the driving of the light emitting device and the pixel circuit that does not perform the on-bias stress OBS operation in the hold period of FIG. 4B.

Referring to FIG. 4C, the pixel circuit may operate including only the emission period Te" during the hold period. In other words, in the pixel circuit, the on-bias stress OBS operation is not performed during the hold period, the second scan signal SC2(n) and the third scan signal SC3(n) are always at a high voltage, and the fourth scan signal SC4(n) is always at a low voltage. That is, the second transistor T2 and the fifth to seventh transistors T5, T6, and T7 are always turned off.

Figure 5A:
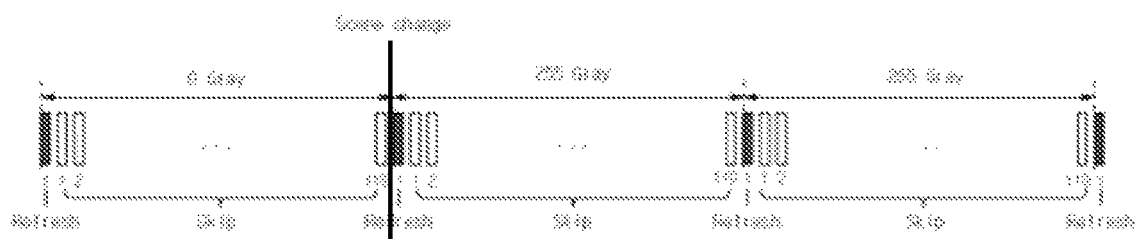
FIGS. 5A and 5B are views for describing multi-refresh driving when low-frequency driving is performed in a VRR mode.
Figure 5B:
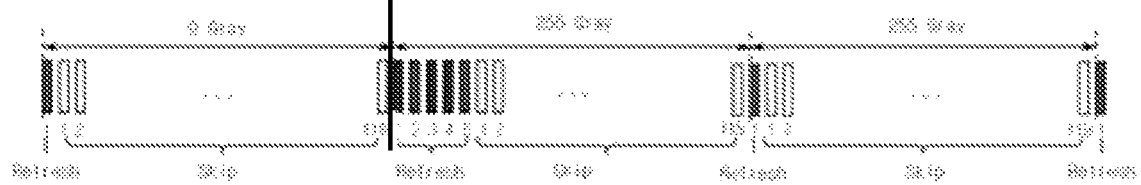

FIGS. 5A and 5B are views for describing multi-refresh driving when low-frequency driving is performed in the VRR mode.

Referring to FIGS. 5A and 5B, the refresh period having the same image data within one frame is repeated, so that a time required for display luminance to reach a target level during the low-frequency driving is reduced, abnormal phenomena such as flicker are minimized.

Since a cycle in which the pixel circuit is refreshed in driving at a low frequency such as a refresh rate of 1 Hz is increased, some transistors are implemented with oxide transistors with good off current characteristics to minimize leakage. The oxide transistor is effective in reducing leakage current due to low off-current, but has a relatively slow response speed due to a lower electron mobility than that of a polycrystalline silicon transistor.

Namely, as shown in FIG. 5A, in a case where one frame is composed of one refresh period and 119 hold periods, when gradation change of the image or scene change occurs, a delay for the display luminance to reach a target level may occur.

Accordingly, after the gradation change of the image, the plurality of refresh periods is, as shown in FIG. 5B, included in the first frame, so that the time required for the display luminance to reach a target level may be shortened. For example, after the gradation change of the image, the first frame may include five refresh periods and 115 hold periods having the same image data. However, the number of refresh periods and the number of hold periods in one frame are not limited thereto. As such, having the plurality of refresh periods during the low-frequency driving may be referred to as multi-refresh driving.

According to the display device 1 according to the aspect, when the display device 1 is driven at a refresh rate lower than an original refresh rate, the display device 1 may be driven while at least one of scan start signals (SVST1 to SVST4 shown in FIG. 6) provided from the controller 200 to the gate driver 300 is maintained at a low voltage. In this case, a crack may occur in a scan start signal wiring provided with the at least one scan start signal which is maintained at a low voltage in a bending region BR to be described later of the display device 1. To solve this problem, when the display device 1 according to the aspect is driven at a low refresh rate in the bending region BR, dummy wirings to which a voltage lower than the corresponding low voltage is applied are additionally arranged around the wirings maintained at a low voltage, so that it is possible to prevent in advance cracks in the wirings maintained at the corresponding low voltage.

Figure 6:
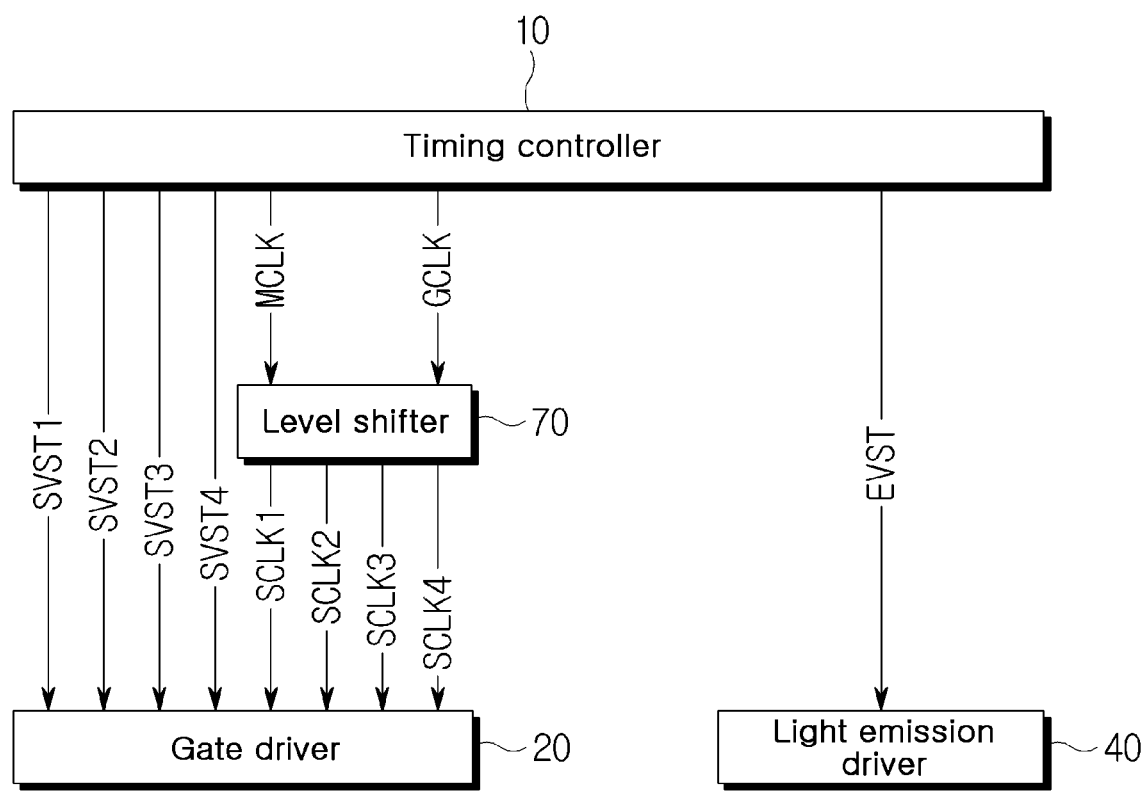
FIG. 6 is a plan layout view of the display device according to the aspect of the present disclosure.

FIG. 6 is a block diagram showing a relationship between a timing controller, the level shifter, the gate driver, and a light emitting driver of the display device according to the aspect.

Referring to FIG. 6, a plurality of signals may be applied from the controller 200 to the gate driver 300 of the display device 1. The plurality of signals may be provided from the controller 200 to the gate driver 300 through a plurality of signal wirings.

For example, as shown in FIG. 6, first to fourth scan start signals SVST1 to SVST4 and first to fourth scan clock signals SCLK1 to SCKL4 may be provided from the controller 200 to the scan driver 320. Also, a first light emission start signal EVST1 may be provided from the controller 200 to the emission control signal driver 310. The gate driver 300 may include the first scan signal generators SC1(1) to SC1(n), the second scan signal generators SC2_O(1) to SC2_O(n) and SC2_E(1) to SC2_E(n), the third scan signal generators SC3(1) to SC3(n), and the fourth scan signal generators SC4(1) to SC4(n) described in FIG. 2, which generate the first scan signal SC1, the second scan signal SC2, the third scan signal SC3, and the fourth scan signal SC4, respectively, and the emission control signal generators EM(1) to EM(n) which generate the emission control signals EM(1) to EM(n). By the first to fourth scan start signals SVST1 to SVST4 described above, each register may provide the first to fourth scan clock signals SCLK1 to SCKL4 provided respectively to the first scan signal generators SC1(1) to SC1(n), the second scan signal generators SC2_O (1) to SC2_O(n) and SC2_E(1) to SC2_E(n), and the third scan signal generators SC3(1) to SC3(n) to the scan lines SCL1 to SCL4 in the form of scan signals SC1 to SC4, respectively. Also, the first emission start signal EVST1 may be provided from the controller 200 to the emission control signal driver 310.

Figure 7:
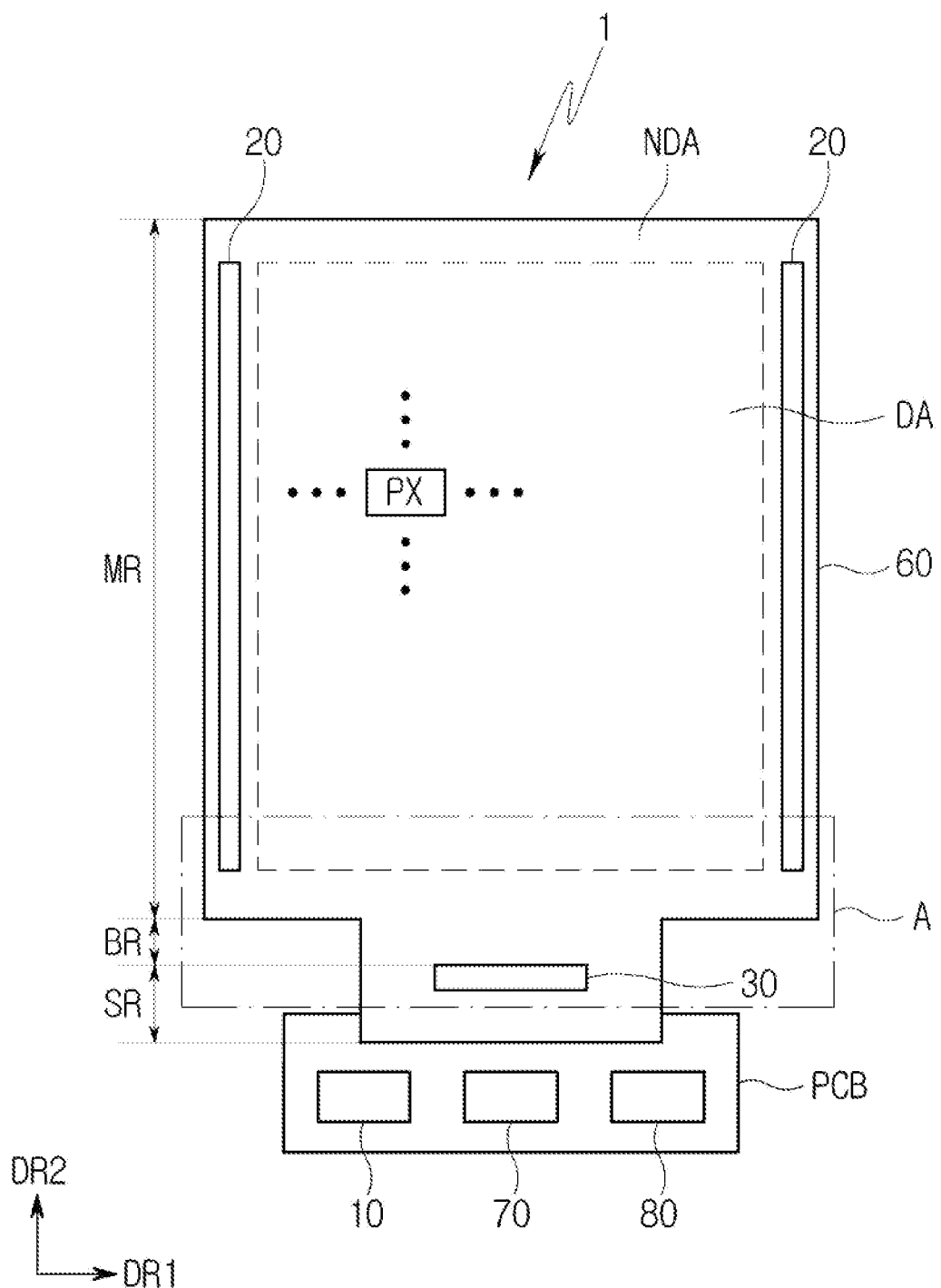
FIG. 7 is a cross-sectional view showing that the display device according to FIG. 6 has been bent.
Figure 8:
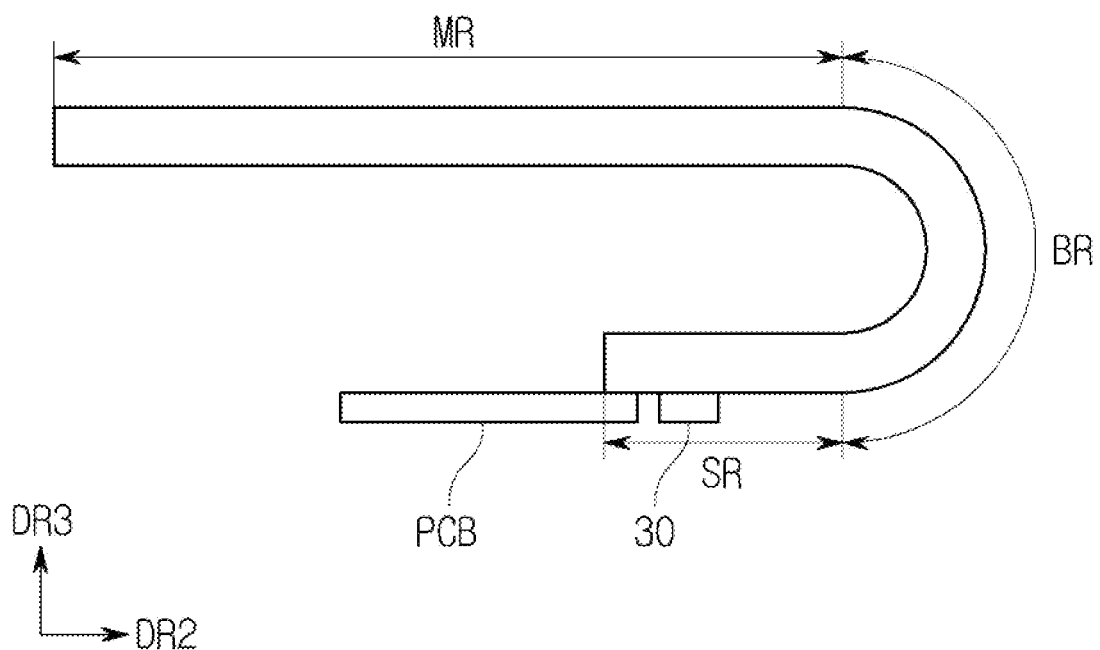
FIG. 8 is a cross-sectional view of a display area of the display device according to FIG. 6.

FIG. 7 is a plan layout view of the display device according to the aspect. FIG. 8 is a cross-sectional view showing that the display device according to FIG. 7 has been bent.

Referring to FIGS. 7 and 8, the display device 1 according to the present disclosure may include a main region MR, the bending region BR, and a sub-region SR. The main region MR may include a display area DA and a non-display area NDA.

The bending region BR may be disposed between the main region MR and the sub-region SR, and may connect the main region MR and the sub-region SR. A width of the bending region BR in a first direction DR1 may be less than a width of the main region MR in the first direction DR1 and a width of the sub-region SR in the first direction DR1.

The bending region BR may be bent in the thickness direction so that the main region MR and the sub-region SR may face each other. The gate driver 300 may be disposed in the non-display area NDA of the main region MR. For example, the gate driver 300 may be located on the other side of the display area DA in the first direction DR1 or on one side of the display area DA in the first direction DR1. FIG. 7 shows illustratively that a plurality of the gate drivers 300 are located on the other side of the display area DA in the first direction DR1 and on one side of the display area DA in the first direction DR1, respectively.

A data driver 30 may be disposed in the sub-region SR. A printed circuit board (PCB) may be connected to the other end of the sub-region SR. The above-described controller 200, a level shifter 70, and a power driver 80 may be disposed on the printed circuit board (PCB).

Figure 9:
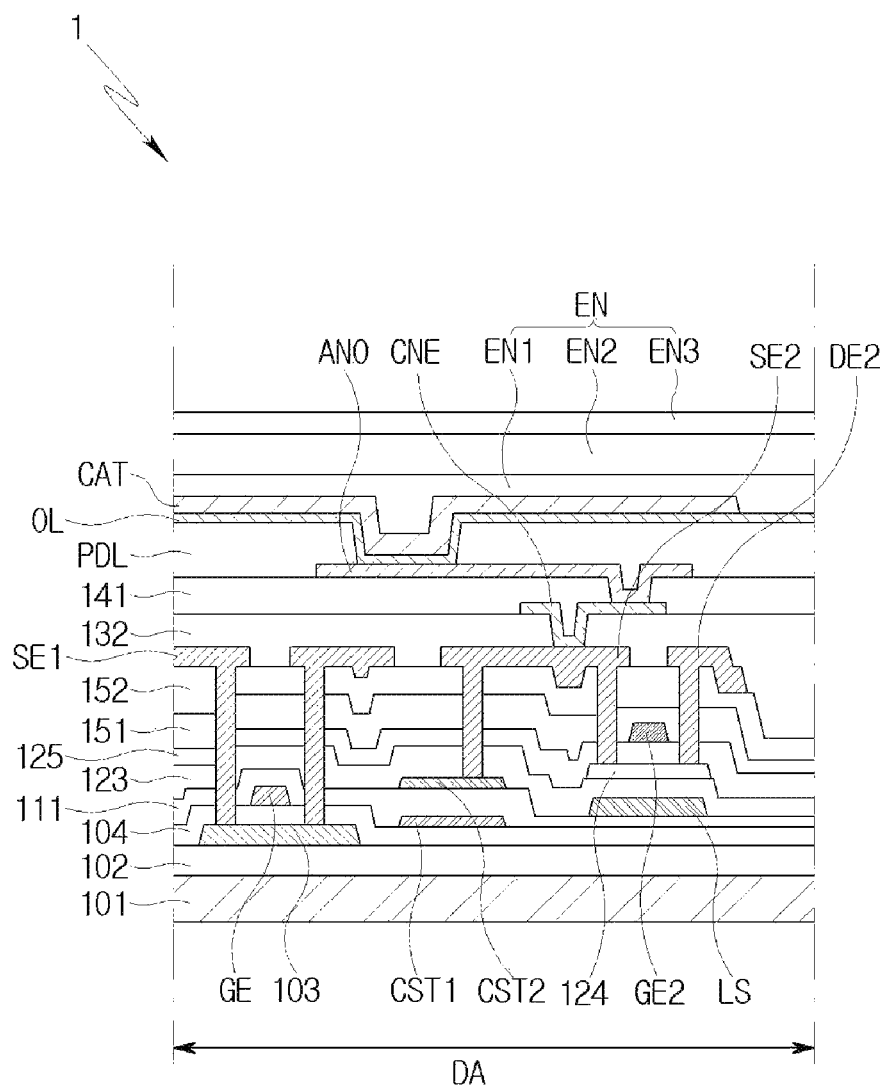
FIG. 9 is a plan view showing an enlarged part denoted by "A" of FIG. 6.

FIG. 9 is a cross-sectional view of the display area of the display device according to FIG. 7.

Referring to FIG. 9, the display device 1 may include a first conductive layer 110 including a substrate 101, a buffer layer 102 on the substrate 101, a semiconductor layer 103 on the buffer layer 102, and a gate insulating layer 104 on the semiconductor layer 103, a first gate electrode GE on the gate insulating layer 104, and a first electrode CST1, a second conductive layer 120 including a first interlayer insulating layer 111 on the first conductive layer 110, a second electrode CST2 on the first interlayer insulating layer 111, and a light shielding pattern LS, a third conductive layer 130 including a second buffer layer 123 on the second conductive layer 120, a second semiconductor layer 124 on the second buffer layer 123, a second gate insulating layer 125 on the second semiconductor layer 124, and a second gate electrode GE2 on the second gate insulating layer 125, a fourth conductive layer 140 including a second-first interlayer insulating layer 151 on the third conductive layer 130, a second-second interlayer insulating layer 152 on the second-first interlayer insulating layer 151, a first source electrode SE1 on the second-second interlayer insulating layer 152, a first drain electrode DE1, a second source electrode SE2, and a second drain electrode DE2, a fifth conductive layer 150 including a first planarization layer 132 on the fourth conductive layer 140, a connection electrode CNE on the first planarization layer 132, a second planarization layer 141 on the fifth conductive layer 150, an anode electrode ANO on the second planarization layer 141, a pixel defining layer PDL on the anode electrode ANO, an organic layer OL on the pixel defining layer PDL, a cathode electrode CAT on the organic layer OL, and an encapsulation layer EN on the cathode electrode CAT.

The substrate 101 may support the respective layers disposed thereon. The base substrate may be disposed over the display area DA and the non-display area NDA. The substrate 101 may be made of an insulating material such as a polymer resin. The example of the polymer material may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), or a combination thereof. The substrate 101 may be a flexible substrate capable of being bent, folded, or rolled. An example of a material constituting the flexible substrate may include polyimide (PI), but is not limited thereto. The substrate 101 may be a rigid substrate made of glass, quartz, or the like.

The buffer layer 102 may be disposed on the substrate 101. The buffer layer 102 may be disposed over the entire display area DA and the non-display area NDA. The buffer layer 102 may prevent the diffusion of impurities or ions and may prevent moisture or external air from penetrating thereinto.

Unlike those shown, the buffer layer 102 may include a plurality of layers. That is, the buffer layer 102 may be formed of layers in which silicon nitride (SiNx) and silicon oxide (SiOx) are alternately stacked at least once.

The first semiconductor layer 103 may be disposed on the buffer layer 102. The first semiconductor layer 103 may include polycrystalline silicon. The first semiconductor layer 103 may include a channel region, a source region, and a drain region. The polycrystalline silicon may be formed by crystallizing amorphous silicon. An example of the crystallization method includes a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method, etc., but is not limited thereto.

The gate insulating layer 104 may be disposed on the first semiconductor layer 103. The gate insulating layer 104 may generally be disposed over the display area DA and the non-display area NDA. The gate insulating layer 104 may have a gate insulating function. The gate insulating layer 104 may include a silicon compound, a metal oxide, or the like. For example, the gate insulating layer 104 may include silicon oxide, silicon nitride, silicon oxynitride, aluminum oxide, tantalum oxide, hafnium oxide, zirconium oxide, titanium oxide, and the like. These may be used alone or in combination with each other. Although the figure shows that the gate insulating layer 104 is formed as a single layer, the gate insulating layer 104 may be formed as a multilayer composed of stacked layers of different materials in some cases.

The first conductive layer 110 may be disposed on the gate insulating layer 104.

In the aspect, the first conductive layer 110 may include the first gate electrode GE and the first electrode CST1 of the holding capacitor. In addition, the first conductive layer 110 may further include a scanning signal line for transmitting a scan signal to the first gate electrode GE. The first gate electrode GE may be disposed to overlap with the channel region of the first semiconductor layer 103.

The first gate electrode GE and the first electrode CST1 of the holding capacitor may be made of the same material by the same process. For example, the first conductive layer 110 may include one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In addition, although the figure shows only the case where the first conductive layer 110 is a single layer, the first conductive layer 110 may be formed as a multilayer in some cases. In this case, the multilayer of the first conductive layer 110 may be formed of stacked layers of different metals among the above-mentioned metals.

The first interlayer insulating layer 111 may be disposed on the first conductive layer 110. The first interlayer insulating layer 111 may be disposed over the display area DA and the non-display area NDA.

The first interlayer insulating layer 111 may insulate the first conductive layer 110 from the second conductive layer 120. The first interlayer insulating layer 111 may be an interlayer insulating film.

The first interlayer insulating layer 111 may include an inorganic insulating material such as silicon oxide, silicon nitride, silicon oxynitride, hafnium oxide, aluminum oxide, titanium oxide, tantalum oxide, or zinc oxide, etc., or an organic insulating material such as an acrylic resin (polyacrylates resin), an epoxy resin, a phenolic resin, a polyamides resin, a polyimides resin, an unsaturated polyesters resin, a poly phenylenethers resin, a polyphenylenesulfides resin, a benzocyclobutene (BCB), etc. Although the figure shows that the first interlayer insulating layer 111 is formed as a single layer, the first interlayer insulating layer 111 is not limited thereto and may be a multilayer composed of stacked layers of different materials.

The second conductive layer 120 may be disposed on the first interlayer insulating layer 111. The second conductive layer 120 may include the second electrode CST2 of the holding capacitor, and the light shielding pattern LS. The second electrode CST2 may overlap the first electrode CST1 with the first interlayer insulating layer 111 placed therebetween. That is, the first electrode CST1 and the second electrode CST2 may form the holding capacitor Cst having the first interlayer insulating layer 111 as a dielectric layer. The light shielding pattern LS may overlap with the second semiconductor layer 124.

The second conductive layer 120 may include one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). In the aspect, the second conductive layer 120 may be made of the same material as the material of the above-described first conductive layer 110.

Although the figure shows only the case where the second conductive layer 120 is a single layer, the second conductive layer 120 may be formed as a multilayer in some cases.

The second buffer layer 123 may be disposed on the second conductive layer 120. The second buffer layer 123 may include at least one of the described materials of the buffer layer 102.

The second semiconductor layer 124 may be disposed on the second buffer layer 123.

The second semiconductor layer 124 may include an oxide semiconductor. The oxide semiconductor may include, for example, a binary compound (ABx), a ternary compound (ABxCy), a quaternary compound (ABxCyDz) which contain indium, zinc, gallium, tin, titanium, aluminum, hafnium (Hf), zirconium (Zr), magnesium (Mg), and the like. In the aspect, the second semiconductor layer 124 may include ITZO (an oxide including indium, tin, and titanium) or IGZO (an oxide including indium, gallium, and tin).

The second gate insulating layer 125 may be disposed on the second semiconductor layer 124. The second gate insulating layer 125 may include at least one of the described materials of the gate insulating layer 104.

The third conductive layer 130 may be disposed on the second gate insulating layer 125. The third conductive layer 130 may include the second gate electrode GE2. The third conductive layer 130 may include at least one of the described materials of the first conductive layer 110. The second gate electrode GE2 may overlap with the channel region of the second semiconductor layer 124.

The second-first interlayer insulating layer 151 and the second-second interlayer insulating layer 152 may be disposed on the third conductive layer 130. The second-first interlayer insulating layer 151 and the second-second interlayer insulating layer 152 may insulate between the third conductive layer 130 and the fourth conductive layer 140.

Each of the second-first interlayer insulating layer 151 and the second-second interlayer insulating layer 152 may include at least one of the described materials of the first interlayer insulating layer 111.

The fourth conductive layer 140 may be disposed on the second-second interlayer insulating layer 152.

The fourth conductive layer 140 may include the first source electrode SE1, the first drain electrode DE1, the second source electrode SE2, and the second drain electrode DE2. The first source electrode SE1 may be connected to the source region of the first semiconductor layer 103. The first drain electrode DE1 may be connected to the drain region of the first semiconductor layer 103. The second source electrode SE2 may be connected to a source region of the second semiconductor layer 124. The second drain electrode DE2 may be connected to a drain region of the second semiconductor layer 124.

The second source electrode SE2 may also be connected to the second electrode CST2. The second source electrode SE2 may be connected to the upper connection electrode CNE.

The first planarization layer 132 may be disposed on the fourth conductive layer 140. The first planarization layer 132 may include an organic insulating material such as an acrylic resin (polyacrylates resin), an epoxy resin, a phenolic resin, a polyamides resin, a polyimides resin, an unsaturated polyesters resin, a poly phenylenethers resin, a polyphenylenesulfides resin, a benzocyclobutene (BCB), etc.

The fifth conductive layer 150 may be disposed on the first planarization layer 132. The fifth conductive layer 150 may include the connection electrode CNE. The connection electrode CNE may pass through the first planarization layer 132 and may be connected to the described second source electrode SE2.

The second planarization layer 141 may be disposed on the fifth conductive layer 150. The second planarization layer 141 may include an organic insulating material such as an acrylic resin (polyacrylates resin), an epoxy resin, a phenolic resin, a polyamides resin, a polyimides resin, an unsaturated polyesters resin, a poly phenylenethers resin, a polyphenylenesulfides resin, a benzocyclobutene (BCB), etc.

The anode electrode ANO may be disposed on the second planarization layer 141. The anode electrode ANO may pass through the second planarization layer 141 and may be connected to the connection electrode CNE, and may be connected to a source electrode SDE through the connection electrode CNE.

The pixel defining layer PDL may be disposed on the anode electrode ANO. The pixel defining layer PDL may include an opening that exposes the anode electrode ANO. The pixel defining layer PDL may be formed of an organic insulating material or an inorganic insulating material. As an example, the pixel defining layer PDL may include a material such as a photoresist, a polyimides resin, an acrylic resin, a silicon compound, or a polyacrylic resin.

The organic layer OL may be disposed on a top surface of the anode electrode ANO and within the opening of the pixel defining layer PDL. Although the figure shows that the organic layer OL is disposed only within the opening of the pixel defining layer PDL, but the organic layer OL is not limited thereto. The organic layer OL may be disposed to extend from the opening of the pixel defining layer PDL to a top surface of the pixel defining layer PDL.

The organic layer OL may include an organic light emitting layer, a hole injection/transport layer, and an electron injection/transport layer.

The cathode electrode CAT is disposed on the organic layer OL and the pixel defining layer PDL. The cathode electrode CAT may be a common electrode disposed across a plurality of pixels PX of the display area DA. The organic layer OL, the anode electrode ANO, and the cathode electrode CAT may form an organic light emitting device (OLED).

The encapsulation layer EN is disposed on the cathode electrode CAT. The encapsulation layer EN may cover the organic light emitting device (OLED). The encapsulation layer EN may be a stacked layer formed by alternatively stacking an inorganic layer and an organic layer. For example, the encapsulation layer EN may include a first inorganic layer EN1, an organic layer EN2, and a second inorganic layer EN3 which are sequentially stacked.

The above-described first semiconductor layer 103, the first gate electrode GE, the first source electrode SE, and the first drain electrode DE1 may constitute the LTPS thin film transistor described above in FIG. 2. The second semiconductor layer 124, the second gate electrode GE2, the second source electrode SE2, and the second drain electrode DE2 may configure the oxide semiconductor thin film transistor described above in FIG. 2.

Figure 10:
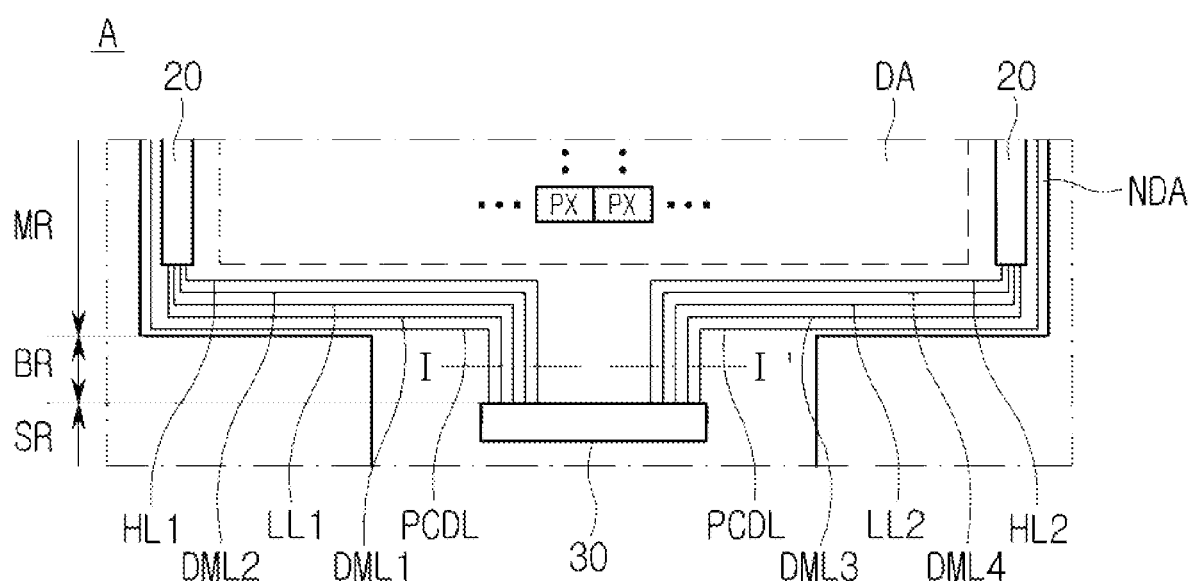
FIG. 10 is a cross-sectional view taken along line I-I' of FIG. 9.
Figure 11:
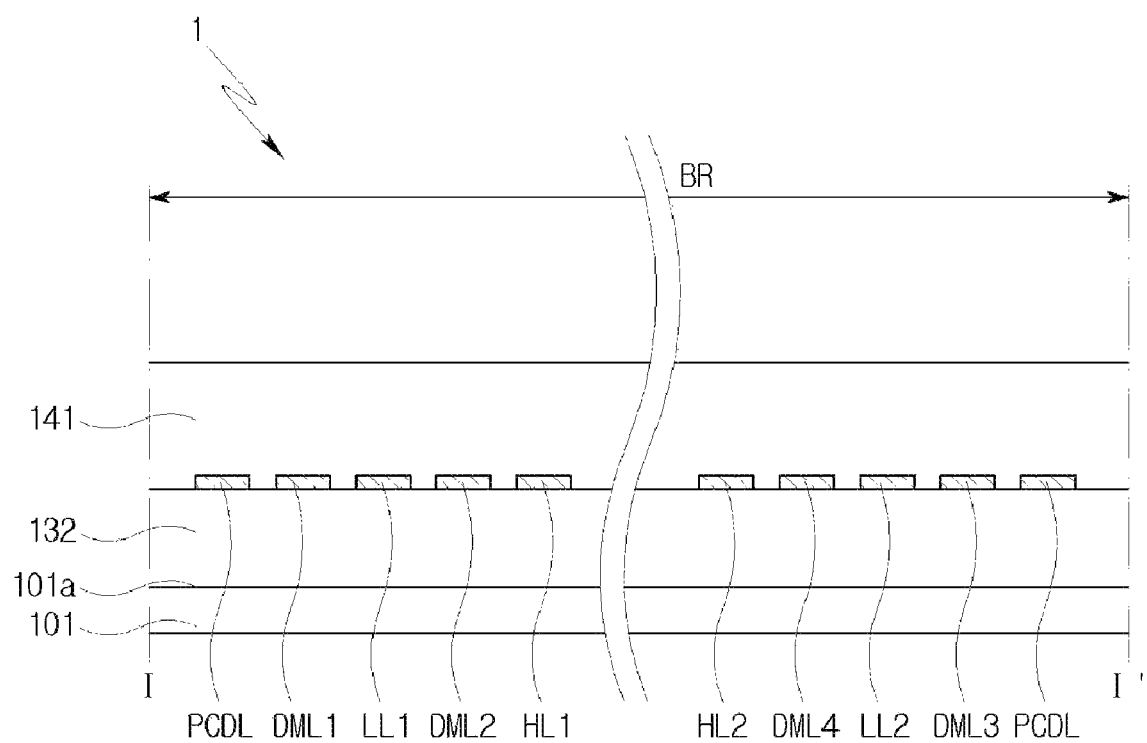
FIG. 11 is a mimetic diagram showing that a first low-voltage wiring and a second low-voltage wiring by using a dummy wiring according to the aspect of the present disclosure.
Figure 12:
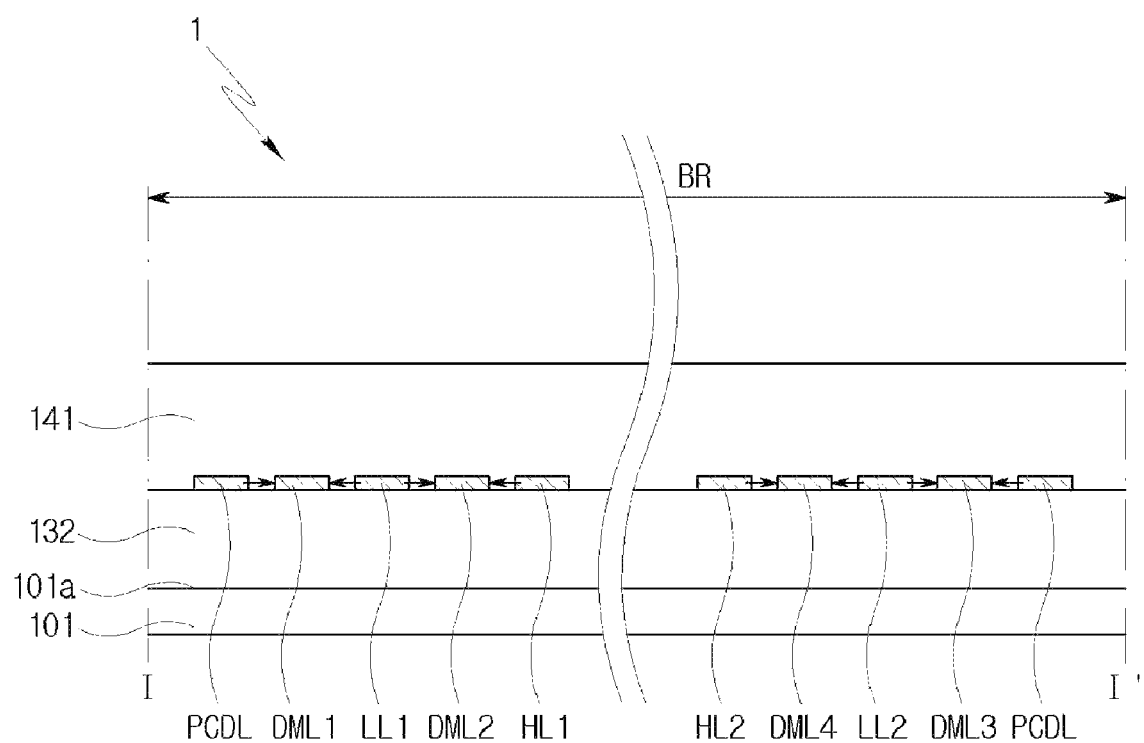
FIG. 12 is a cross-sectional view of a bending region of a display device according to another aspect of the present disclosure.

FIG. 10 is a plan view showing an enlarged part denoted by "A" of FIG. 7. FIG. 11 is a cross-sectional view taken along line I-I' of FIG. 10. FIG. 12 is a mimetic diagram showing that a first low-voltage wiring and a second low-voltage wiring by using a dummy wiring according to the aspect of the present disclosure.

Referring to FIGS. 10 to 12, the display device 1 according to the aspect may include a plurality of wirings connecting the data driver 30 and the gate driver 300. Also, the display device 1 may include a wiring that extends from the data driver 30 and extends along the outside of the gate driver 300. The wiring that extends along the outside of the gate driver 300 may include a crack detection wiring PCDL. The crack detection wiring PCDL may receive, from the data driver 30, a predetermined crack detection voltage for detecting a crack. One end of the crack detection wiring PCDL may be connected to the data driver 30. The crack detection wiring PCDL may extend along the non-display area NDA of the other side of the display area DA in the first direction DR1, the non-display area NDA of one side of the display area DA in a second direction DR2, and the non-display area NDA of one side of the display area DA in the first direction DR1. The other end of the crack detection wiring PCDL may be connected to the data driver 30. The crack detection voltage provided to the crack detection wiring PCDL may be a ground voltage GND.

The plurality of wirings connecting the data driver 30 and the gate driver 300 may include a first wiring LL1, a second wiring HL1, a third wiring LL2, and a fourth wiring HL2. The first wiring LL1, the second wiring HL1, the third wiring LL2, and the fourth wiring HL2 and the crack detection wiring PCDL are arranged in the same layer, respectively, may be arranged between the first planarization layer 132 and the second planarization layer 141, and may be arranged in the fifth conductive layer (150 in FIG. 9). However, the first wiring LL1, the second wiring HL1, the third wiring LL2, and the fourth wiring HL2 and the crack detection wiring PCDL may be disposed in a conductive layer other than the fifth conductive layer 150.

The first wiring LL1 and the third wiring LL2 may be low-voltage wirings to which a low voltage is applied in the hold period HP of FIGS. 4A to 4C, respectively, and the second wiring HL1 and the fourth wiring HL2 may be high-voltage wirings to which a high voltage is applied in the hold period HP of FIGS. 4A to 4C, respectively. That is, in the hold period HP of FIGS. 4A to 4C, a first voltage may be applied to the first wiring LL1, a second voltage may be applied to the second wiring HL1, and a third voltage may be applied to the crack detection wiring PCDL. The first voltage may be lower than the second voltage and the third voltage, respectively. The second voltage may be higher than the third voltage. Similarly, in the hold period HP of FIGS. 4A to 4C, a fourth voltage may be applied to the third wiring LL2, a fifth voltage may be applied to the fourth wiring HL2, and the third voltage may be applied to the crack detection wiring PCDL. The fourth voltage may be lower than the fifth voltage and the third voltage, respectively. The fifth voltage may be higher than the third voltage.

A voltage applied to the wirings to which a lower voltage is applied, that is to say, the first wiring LL1 and the third wiring LL2 is lower than a voltage applied to the adjacent wiring PCDL, HL1, and HL2. Accordingly, under high temperature and high humidity conditions, some of the components of the etchant provided from the plurality of wirings connecting the data driver 30 and the gate driver 300 and from the crack detection wiring PCDL may gather around the first wiring LL1 and the third wiring LL2 in the form of a cation. In this case, the pH of some areas of the substrate 101 that overlap the bottoms of the first wiring LL1 and the third wiring LL2 is increased, and then there is a decrease in physical properties of the corresponding areas, so that cracks may occur in the first wiring LL1 and the third wiring LL2, respectively. In particular, in the bending region BR, large bending stress is applied to each of the wirings and the substrate 101, so that cracks may be highly likely to occur.

However, in the case of the display device 1 according to the aspect, dummy wirings DML1, DML2, DML3, and DML4 are respectively disposed around the wiring to which a low voltage is applied, and the first voltage and a voltage lower than the fourth voltage are applied to the dummy wirings DML1, DML2, DML3, and DML4 respectively, so that it is possible to prevent in advance cracks from occurring in each of the first and third wirings LL1 and LL2. The first voltage and a voltage lower than the fourth voltage may be applied to the dummy wirings DML1, DML2, DML3, and DML4 respectively only during the hold period HP of FIGS. 4A to 4C. However, the first voltage and a voltage lower than the fourth voltage are not limited thereto, and may be supplied throughout the refresh period RP and hold period HP, or may be provided intermittently within the hold period HP. That is, the dummy wirings DML1, DML2, DML3, and DML4 are respectively disposed around the wiring to which a low voltage is applied, and the first voltage and a voltage lower than the fourth voltage are applied to the dummy wirings DML1, DML2, DML3, and DML4 respectively, so that some of the components of the etchant provided from the plurality of wirings connecting the data driver 30 and the gate driver 300 and from the crack detection wiring PCDL may gather around the dummy wirings DML1, DML2, DML3, and DML4 in the form of a cation. Accordingly, it is possible to prevent in advance cracks from occurring in each of the first and third wirings LL1 and LL2.

For example, the first dummy wiring DML1 may be disposed between the crack detection wiring PCDL and the first wiring LL1 (or the first low-voltage wiring) and may receive a sixth voltage. The sixth voltage may be lower than the first voltage. The second dummy wiring DML2 may be disposed between the second wiring HL1 and the first wiring LL1 (or the first low-voltage wiring) and may receive a seventh voltage. The seventh voltage may be lower than the first voltage. The seventh voltage and the sixth voltage may be the same or may be different.

For example, the third dummy wiring DML3 may be disposed between the crack detection wiring PCDL and the third wiring LL2 (or the second low-voltage wiring) and may receive an eighth voltage. The eighth voltage may be lower than the fourth voltage. The fourth dummy wiring DML4 may be disposed between the fourth wiring HL2 and the third wiring LL2 (or the second low-voltage wiring) and may receive a ninth voltage. The ninth voltage may be lower than the fourth voltage. The ninth voltage and the eighth voltage may be the same or may be different.

Hereinafter, other aspects of the display device 1 according to an aspect will be described.

Figure 13:
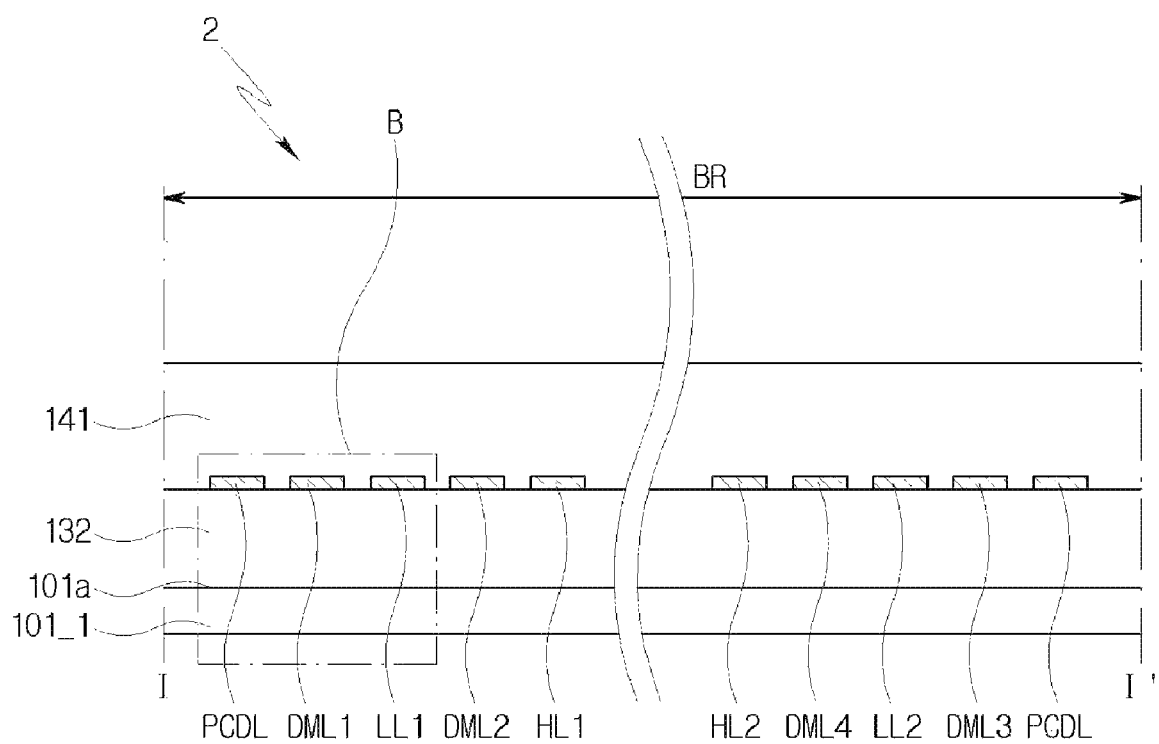
FIG. 13 is a cross-sectional view showing an enlarged part denoted by "B" of FIG. 12.
Figure 14:
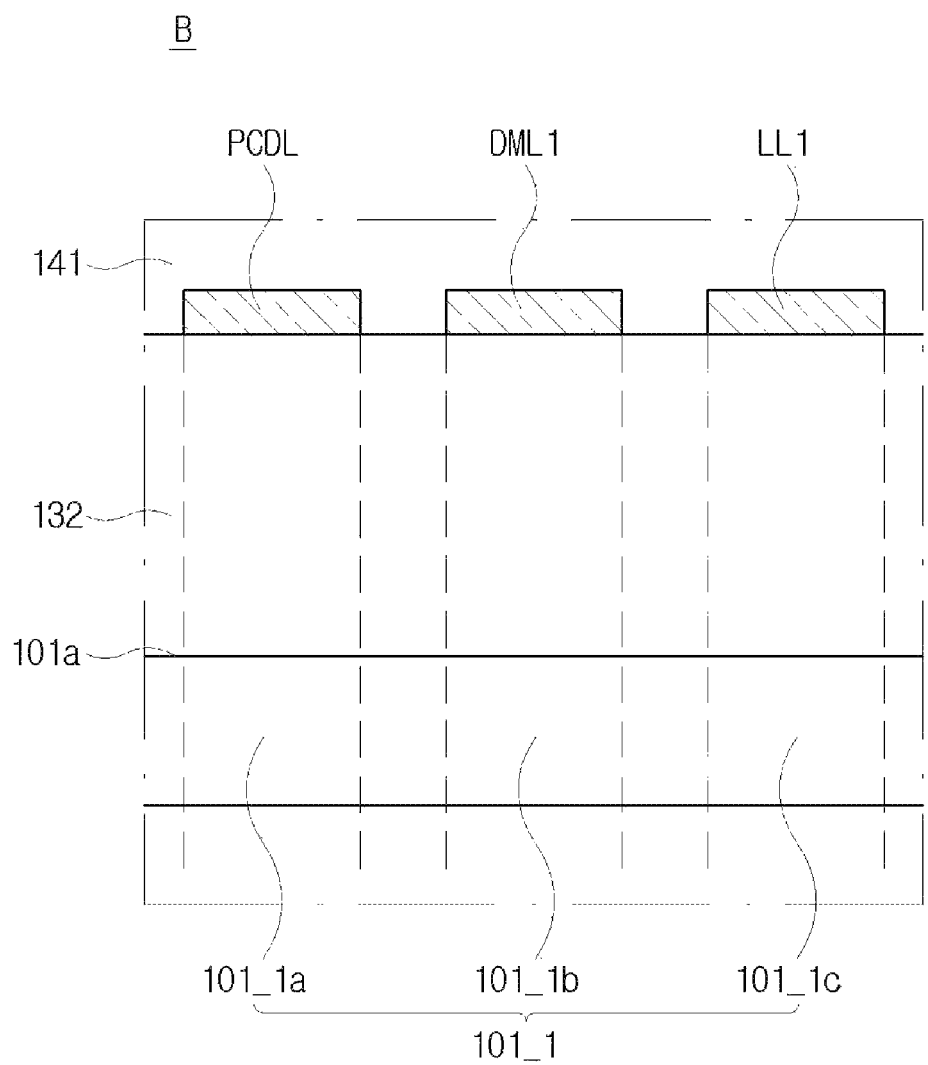
FIG. 14 is a cross-sectional view of a display area of a display device according to further another aspect of the present disclosure.

FIG. 13 is a cross-sectional view of the bending region of a display device according to another aspect of the present disclosure. FIG. 14 is a cross-sectional view showing an enlarged part denoted by "B" of FIG. 13.

Referring to FIGS. 13 and 14, a substrate 101_1 of a display device 2 according to the aspect of the present disclosure may include a first substrate portion 101_1a overlapping the crack detection wiring PCDL, a second substrate portion 101_1b overlapping the first dummy wiring DML1, and a third substrate portion 101_1c overlapping the first wiring LL1. The physical properties of the substrate portions 101_1a, 101_1b, and 101_1c may be different. The pHs of the substrate portions 101_1a, 101_1b, and 101_1c may be different from each other. The second substrate portion 101_1b may have the highest pH, the third substrate portion 101_1c may have the next highest pH, and the first substrate portion 101_1a may have the lowest pH. As described above in FIGS. 11 and 12, this is because some of the components of the etchant provided from the plurality of wirings connecting the data driver 30 and the gate driver 300 and from the crack detection wiring PCDL gather around the dummy wirings DML1, DML2, DML3, and DML4 in the form of a cation and is absorbed by the lower substrate 101_1, so that the physical property, for example, pH of the substrate 101_1 is changed. For example, a ground voltage may be applied to the crack detection wiring PCDL, and the ground voltage may be higher than the first voltage supplied to the first wiring LL1 and may be higher than the sixth voltage supplied to the first dummy wiring DML1. Also, the first voltage may be higher than the sixth voltage. Accordingly, the number of cations surrounding the crack detection wiring PCDL may be larger than the number of cations surrounding the first wiring LL1, and the number of cations surrounding the first wiring LL1 may be larger than the number of cations surrounding the first dummy wiring DML1.

In some aspects, the roughness of surfaces 101a of the substrate portions 101_1a, 101_1b, and 101_1c may be different. The roughness of the surface 101a of the second substrate portion 101_1b may be the largest, the roughness of the surface 101a of the third substrate portion 101_1c may be the next largest, and the roughness of the surface 101a of the first substrate portion 101_1a may be the smallest. As described above in FIGS. 11 and 12, this is because some of the components of the etchant provided from the plurality of wirings connecting the data driver 30 and the gate driver 300 and from the crack detection wiring PCDL gather around the dummy wirings DML1, DML2, DML3, and DML4 in the form of a cation and is absorbed by the lower substrate 101_1, so that the physical property, for example, the surface roughness of the substrate 101_1 is changed.

Figure 15:
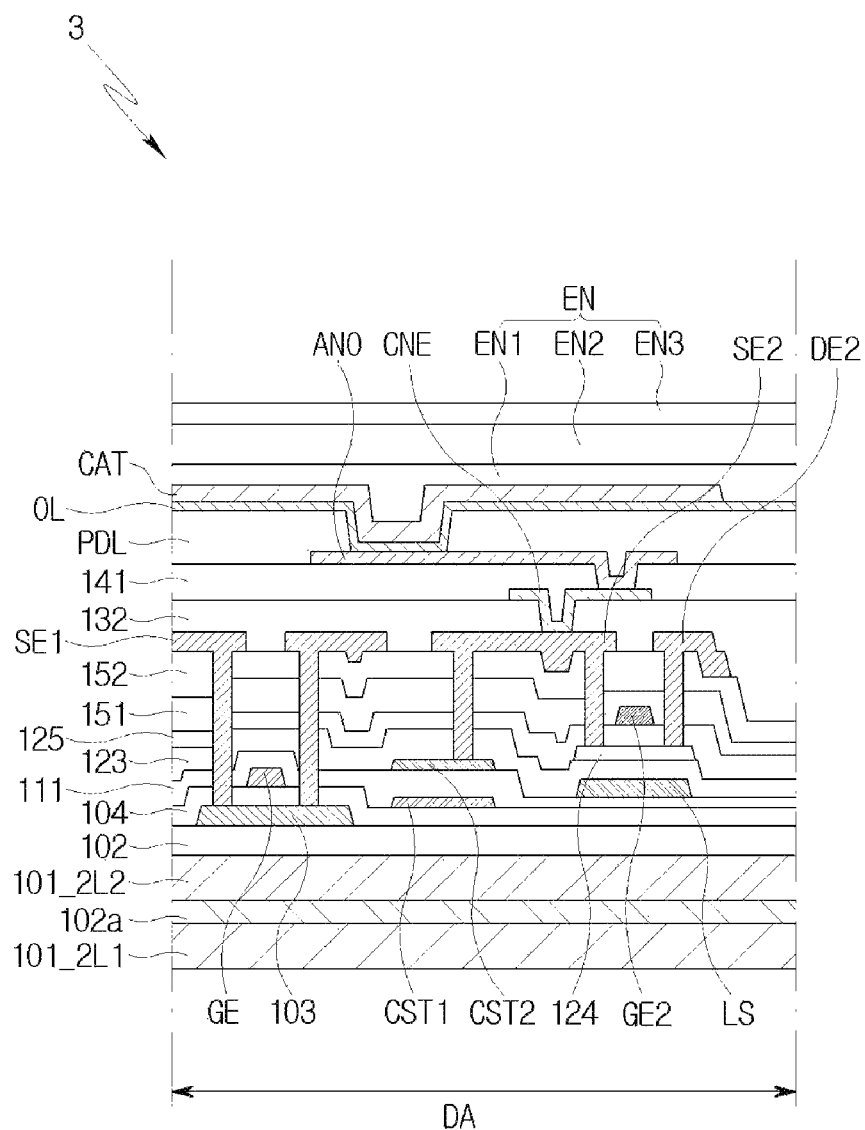
FIG. 15 is a cross-sectional view of a bending region of the display device according to the aspect of the present disclosure.
Figure 16:
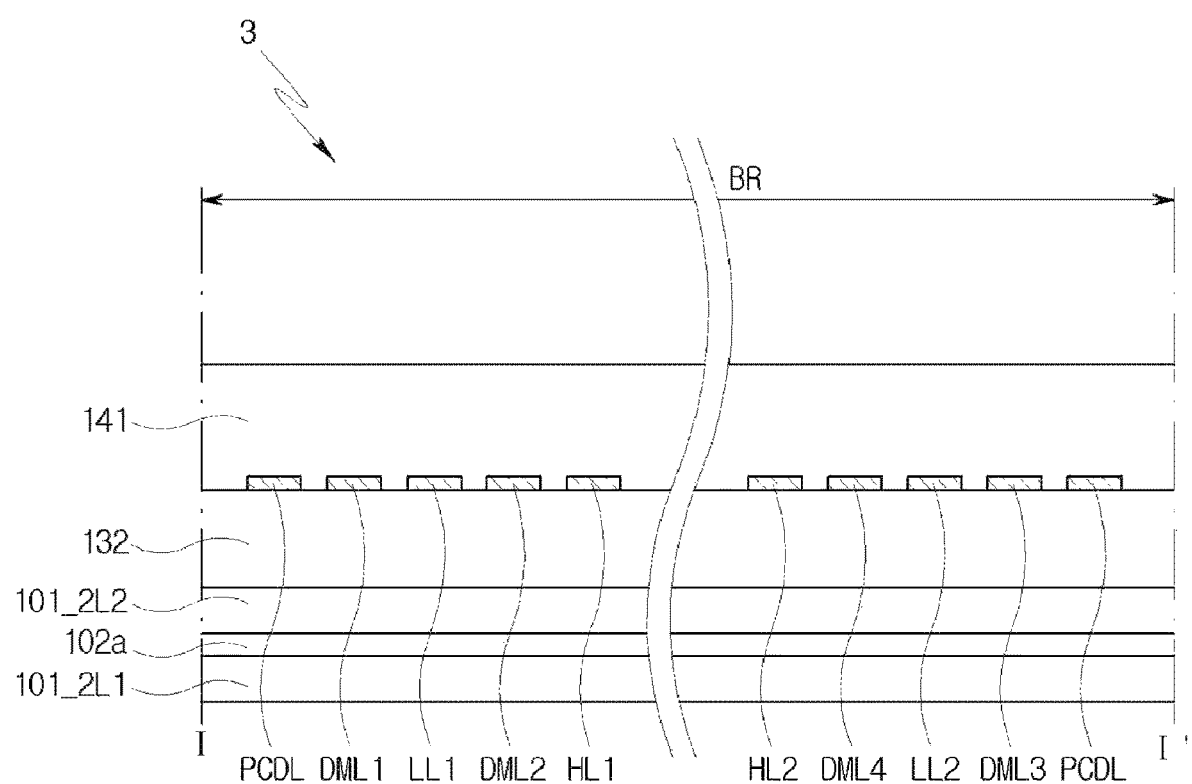
FIG. 16 is a cross-sectional view of a bending region of a display device according to yet another aspect of the present disclosure.

FIG. 15 is a cross-sectional view of a display area of a display device according to further another aspect. FIG. 16 is a cross-sectional view of a bending region of the display device according to the aspect of the present disclosure.

Referring to FIGS. 15 and 16, a substrate of a display device 3 according to the aspect includes a lower substrate 101_2L1, an upper substrate 101_2L2, and a substrate buffer layer 102a between the lower substrate 101_2L1 and the upper substrate 101_2L2. In this regard, the display device 3 is different from the display device 1 according to FIGS. 9 and 11.

Since other descriptions have been made above in FIGS. 9 and 11, detailed descriptions thereof will be omitted.

Figure 17:
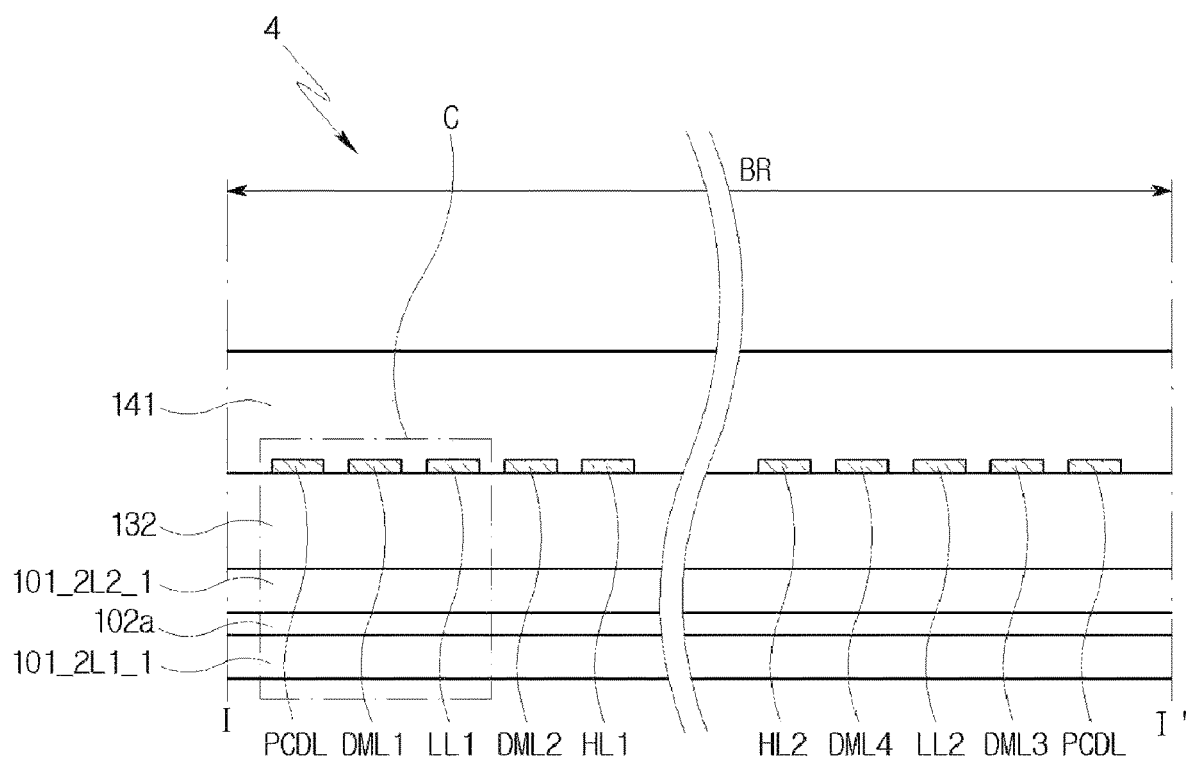
FIG. 17 is a cross-sectional view showing an enlarged part denoted by "C" of FIG. 16.
Figure 18:
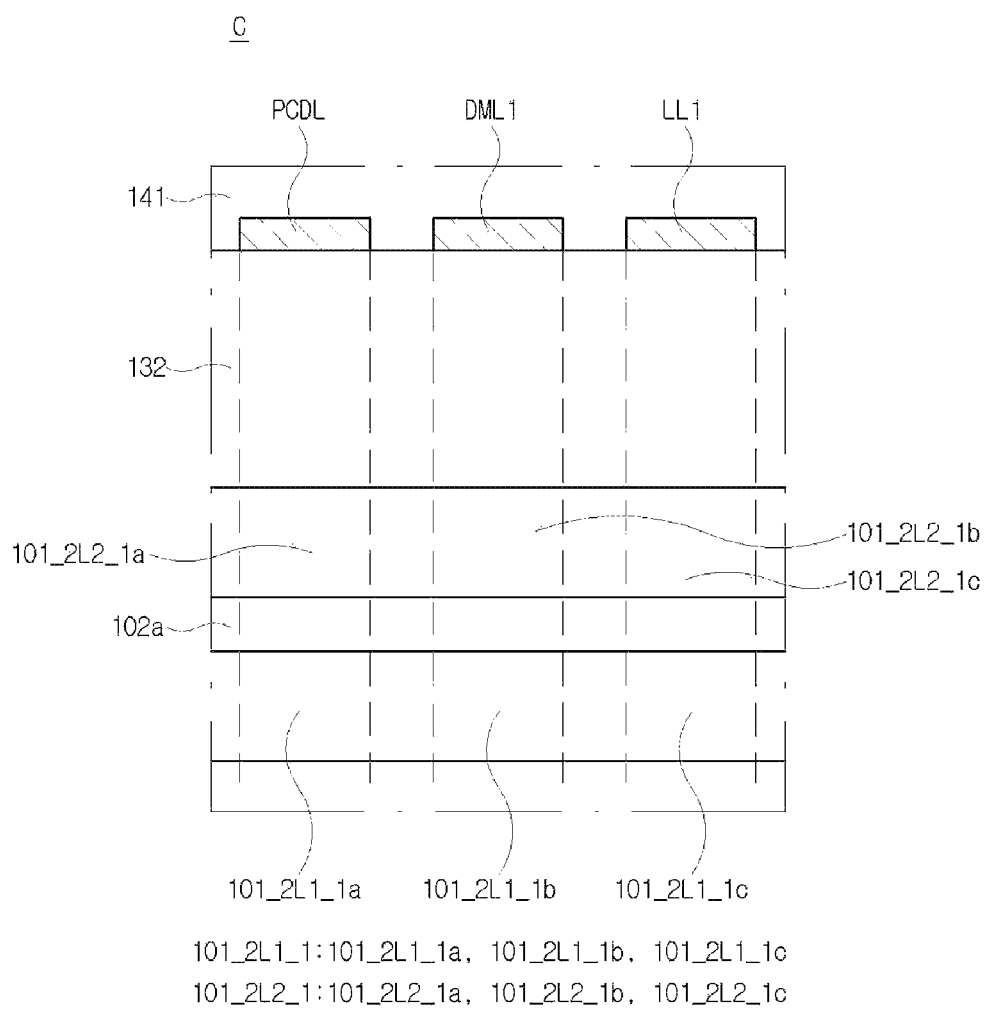
FIG. 18 is a cross-sectional view of a bending region of a display device according to still another aspect of the present disclosure.

FIG. 17 is a cross-sectional view of a bending region of a display device according to yet another aspect of the present disclosure. FIG. 18 is a cross-sectional view showing an enlarged part denoted by "C" of FIG. 17.

Referring to FIGS. 17 and 18, a substrate of a display device 4 according to the aspect includes a lower substrate 101_2L1_1, an upper substrate 101_2L2_1, and the substrate buffer layer 102a between the lower substrate 101_2L1_1 and the upper substrate 101_2L2_1. In this regard, the display device 4 is different from the display device 3 according to FIGS. 15 and 16.

The lower substrate 101_2L1_1 may include a first lower substrate portion 101_2L1_1a overlapping the crack detection wiring PCDL, a second lower substrate portion 101_2L1_1b overlapping the first dummy wiring DML1, and a third lower substrate portion 101_2L1_1c overlapping the first wiring LL1. The physical properties of the lower substrate portions 101_2L1_1a, 101_2L1_1b, and 101_2L1_1c may be different. The pHs of the lower substrate portions 101_2L1_1a, 101_2L1_1b, and 101_2L1_1c may be different from each other. The second lower substrate portion 101_2L1_1b may have the highest pH, the third lower substrate portion 101_2L1_1c may have the next highest pH, and the first lower substrate portion 101_2L1_1a may have the lowest pH.

The upper substrate 101_2L2_1 may include a first upper substrate portion 101_2L2_1a overlapping the crack detection wiring PCDL, a second upper substrate portion 101_2L2_1b overlapping the first dummy wiring DML1, and a third upper substrate portion 101_2L2_1c overlapping the first wiring LL1. The physical properties of the upper substrate portions 101_2L2_1a, 101_2L2_1b, and 101_2L2_1c may be different. The pHs of the upper substrate portions 101_2L2_1a, 101_2L2_1b, and 101_2L2_1c may be different from each other. The second upper substrate portion 101_2L2_1b may have the highest pH, the third upper substrate portion 101_2L2_1c may have the next highest pH, and the first upper substrate portion 101_2L2_1a may have the lowest pH.

In some aspects, the physical properties may be different between the lower substrate portions 101_2L1_1a, 101_2L1_1b, and 101_2L1_1c and the upper substrate portions 101_2L2_1a, 101_2L2_1b, and 101_2L2_1c which correspond in the thickness direction. That is, the pH between the lower substrate portions 101_2L1_1a, 101_2L1_1b, and 101_2L1_1c and the upper substrate portions 101_2L2_1a, 101_2L2_1b, and 101_2L2_1c which correspond in the thickness direction may be different. Since the upper substrate portions 101_2L2_1a, 101_2L2_1b, and 101_2L2_1c are closer to the upper crack detection wiring PCDL, the first dummy wiring DML1, and the first wiring LL1, respectively, the pHs of the upper substrate portions 101_2L2_1a, 101_2L2_1b, and 101_2L2_1c may be higher than the pHs of the corresponding lower substrate portions 101_2L1_1a, 101_2L1_1b, and 101_2L1_1c in the thickness direction.

Figure 19:
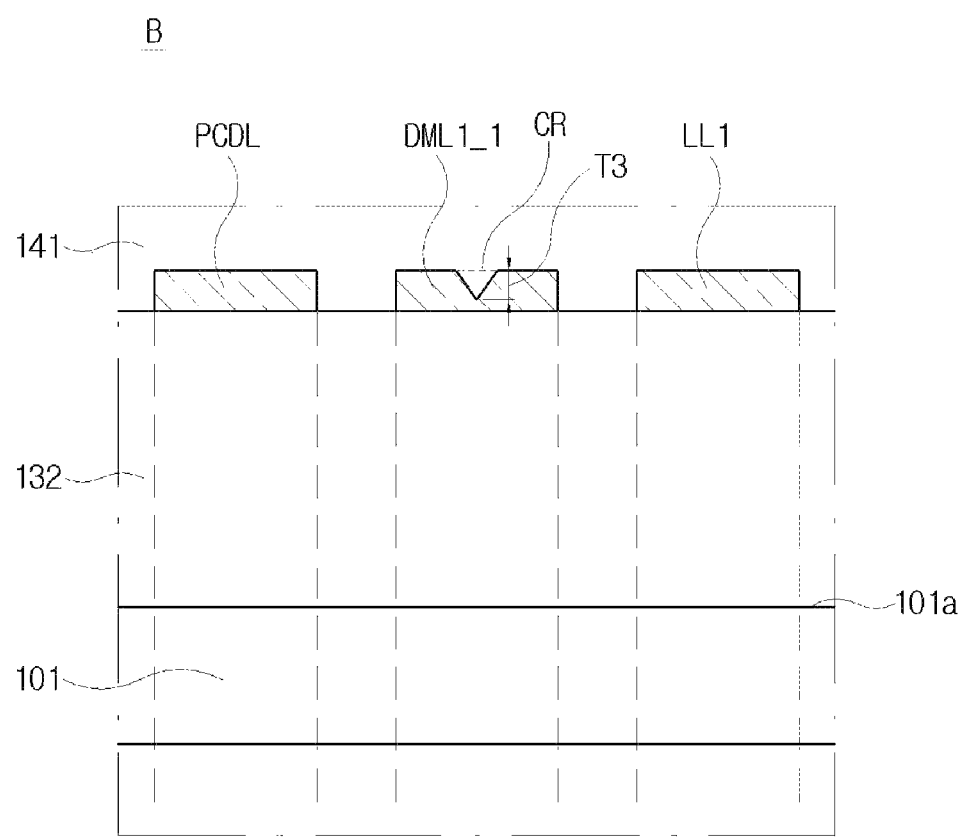
FIG. 19 is a cross-sectional view of a bending region of a display device according to still another aspect of the present disclosure.

FIG. 19 is a cross-sectional view of a bending region of a display device according to still another aspect of the present disclosure.

Referring to FIG. 19, a first dummy wiring DML1_1 may include a crack CR which is recessed from the surface of the first dummy wiring DML1_1 to have a predetermined thickness T3 (or depth).

Since other descriptions have been made above in FIG. 16, detailed descriptions thereof will be omitted.

Figure 20:
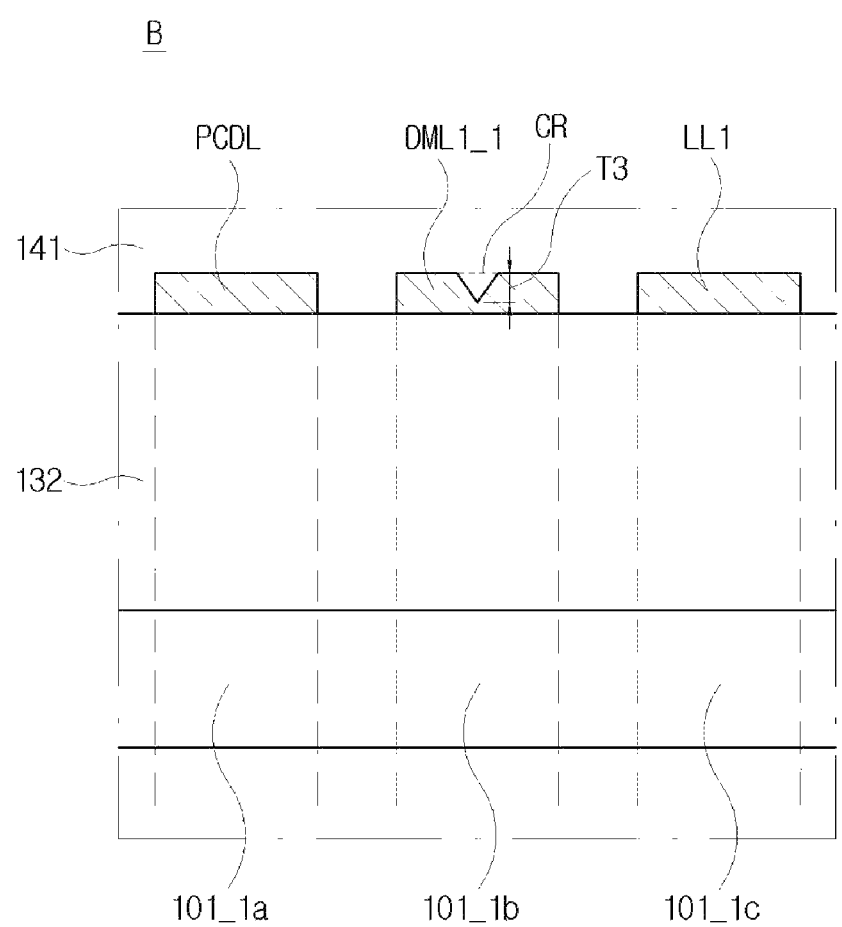
FIG. 20 is a cross-sectional view of a bending region of a display device according to still another aspect of the present disclosure.

FIG. 20 a cross-sectional view of a bending region of a display device according to still another aspect of the present disclosure.

Referring to FIG. 20, the substrate 101_1 of the display device according to the aspect includes, as shown in FIG. 14, the first substrate portion 101_1a overlapping the crack detection wiring PCDL, the second substrate portion 101_1b overlapping the first dummy wiring DML1, and the third substrate portion 101_1c overlapping the first wiring LL1. In this regard, the substrate 101_1 of the display device according to the aspect is different from the display device according to FIG. 19.

Since other descriptions have been made above in FIGS. 14 and 19, detailed descriptions thereof will be omitted.

Figure 21:
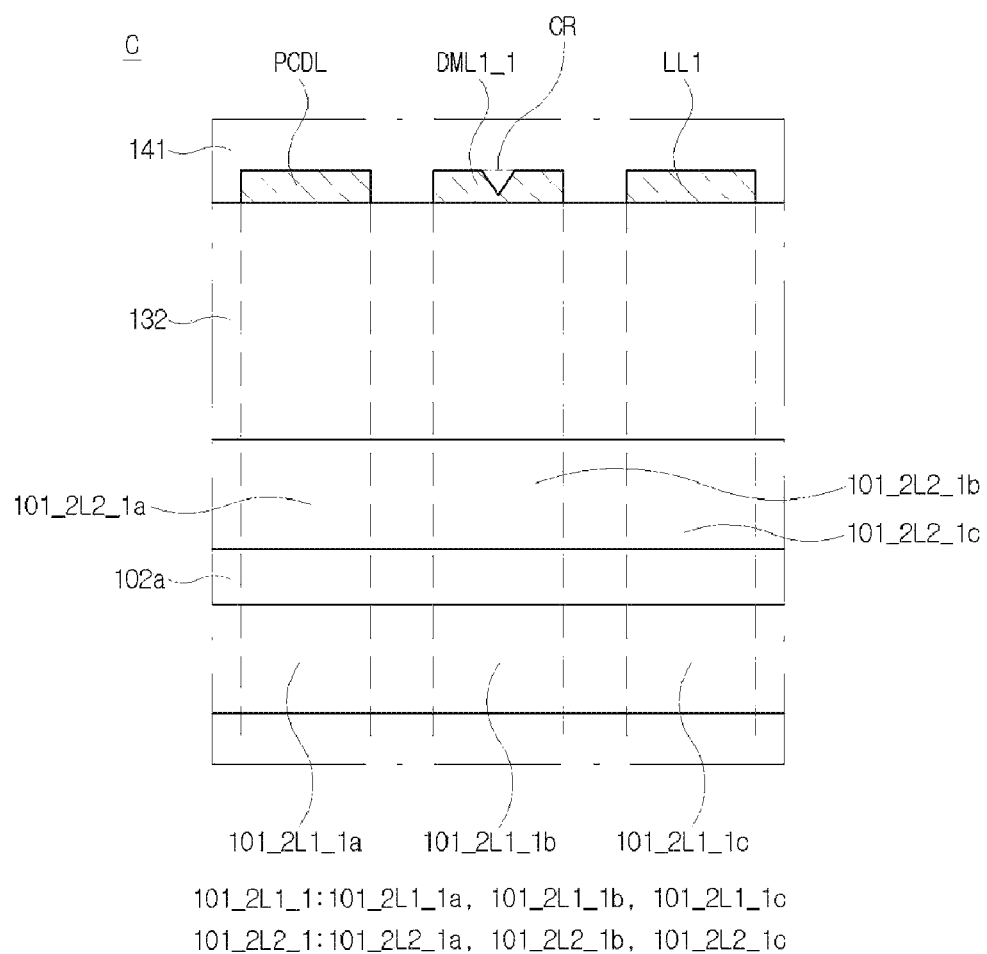
FIG. 21 is a cross-sectional view of a bending region of a display device according to still another aspect of the present disclosure.

FIG. 21 is a cross-sectional view of a bending region of a display device according to still another aspect of the present disclosure.

Referring to FIG. 21, a substrate of the display device according to the aspect includes, as shown in FIG. 18, the lower substrate 101_2L1_1, the upper substrate 101_2L2_1, and the substrate buffer layer 102a between the lower substrate 101_2L1_1 and the upper substrate 101_2L2_1. In this regard, the display device is different from the display device according to FIG. 19.

Since other descriptions have been made above in FIGS. 18 and 19, detailed descriptions thereof will be omitted.

Figure 22:
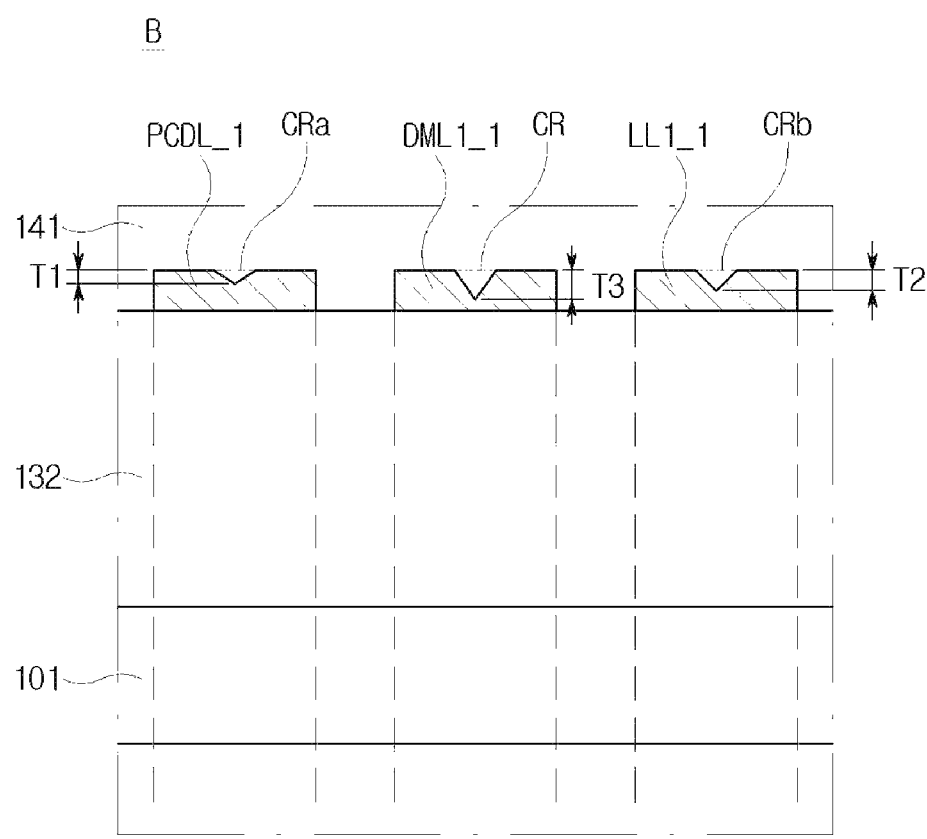
FIG. 22 is a cross-sectional view showing a stacking type of the display device according to the aspect of the present disclosure.

FIG. 22 is a cross-sectional view of a bending region of a display device according to still another aspect of the present disclosure.

Referring to FIG. 22, a crack detection wiring PCDL_1 of the display device according to the aspect includes a first crack CRa and a first line LL1_1 includes a second crack CRb. In this regard, the display device according to the aspect is different from the display device according to FIG. 20. The first crack CRa may have a predetermined thickness T1 (or depth), and the second crack CRb may have a predetermined thickness T2 (or depth). The predetermined thickness T1 (or depth) of the first crack CRa is the smallest, the predetermined thickness T2 (or depth) of the second crack CRb is the next smallest, and the predetermined thickness T3 (or depth) of the first dummy wiring DML1_1 may be the largest.

Since other descriptions have been made above in FIG. 20, detailed descriptions thereof will be omitted.

Figure 23:
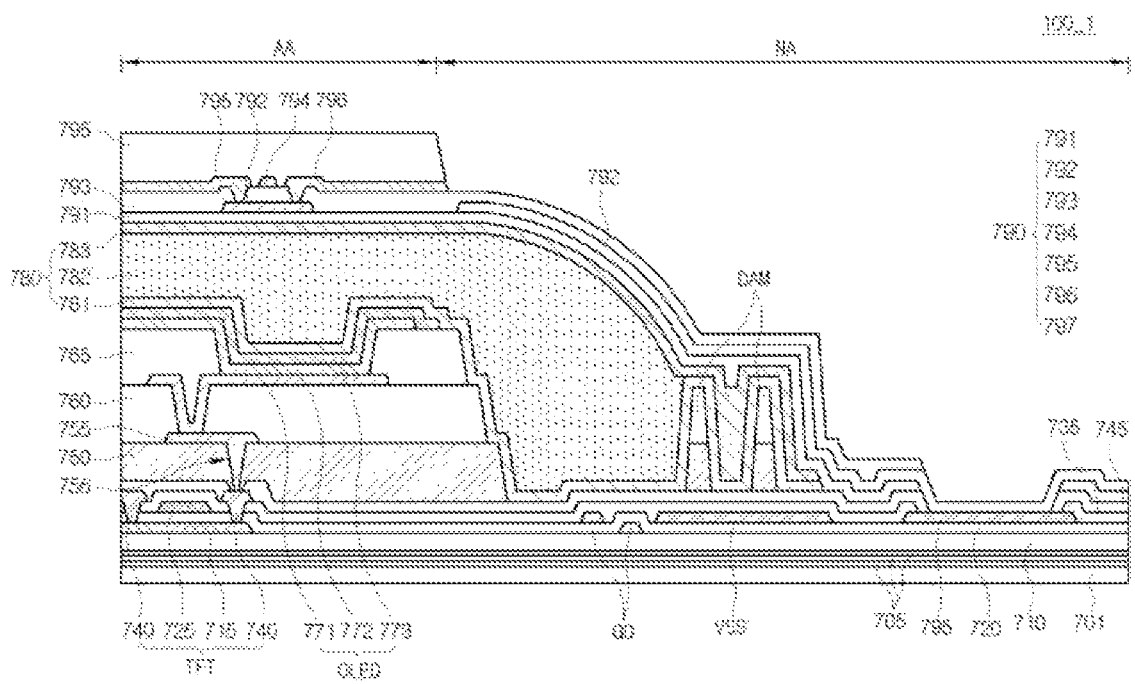
FIG. 23 is a cross-sectional view of a display device according to another aspect of the present disclosure.

FIG. 23 is a cross-sectional view of a display device according to another aspect of the present disclosure.

Referring to FIG. 23, a thin film transistor TFT for driving a light emitting device (OLED) may be disposed in the display area AA on a substrate 701. The thin film transistor TFT may include a semiconductor layer 715, a gate electrode 725, and source and drain electrodes 740. The thin film transistor TFT is a driving transistor DT (see FIG. 4). For convenience of description, only the driving transistor DT is shown among various thin film transistors that may be included in the display device. However, other thin film transistors such as a switching transistor may also be included in the display device. In addition, although the thin film transistor TFT has been described as having a coplanar structure, the thin film transistor may be implemented in another structure such as a staggered structure and is not limited thereto.

The driving transistor DT receives the high potential driving voltage EVDD in response to a data signal provided to the gate electrode 725 of the driving transistor DT and controls the current supplied to the light emitting device (OLED), thereby controlling the amount of light emission of the light emitting device (OLED). Also, the driving transistor DT supplies a constant current by a voltage charged in a storage capacitor (not shown) until a data signal of the next frame is supplied, so that the light emitting device (OLED) may maintain the light emission. A high potential supply line may be formed in parallel to the data line.

As shown in FIG. 23, the thin film transistor TFT may include the semiconductor layer 715 that is disposed on a first insulating layer 710, the gate electrode 725 that overlaps with the semiconductor layer 715 with a second insulating layer 720 placed therebetween, and the source and drain electrodes 740 that is formed on a third insulating layer 735 and contacts with the semiconductor layer 715.

The semiconductor layer 715 may be a region where a channel is formed when the thin film transistor TFT is driven. The semiconductor layer 715 may be formed of an oxide semiconductor, or may be formed of various organic semiconductors such as amorphous silicon (a-Si), polycrystalline silicon (poly-Si), or pentacene. etc., but is not limited thereto. The semiconductor layer 715 may be formed on the first insulating layer 710. The semiconductor layer 715 may include a channel region, a source region, and a drain region. The channel region may overlap with the gate electrode 725 with the first insulating layer 710 placed therebetween and may be between the source and drain electrodes 740. The source region is electrically connected to the source electrode 740 through a contact hole passing through the second insulating layer 720 and the third insulating layer 735. The drain region may be electrically connected to the drain electrode 740 through a contact hole passing through the second insulating layer 720 and the third insulating layer 735. A buffer layer 705 and the first insulating layer 710 may be disposed between the semiconductor layer 715 and the substrate 701. The buffer layer 705 may delay the diffusion of moisture and/or oxygen that has penetrated into the substrate 701. The first insulating layer 710 protects the semiconductor layer 715 and may block various types of defects introduced from the substrate 701.

The uppermost layer of the buffer layer 705, which contacts with the first insulating layer 710, may be formed of a material having etching characteristics different from those of the remaining layers of the buffer layer 705, the first insulating layer 710, the second insulating layer 720, and the third insulating layer 735. The uppermost layer of the buffer layer 705, which contacts with the first insulating layer 710, may be formed of any one of silicon nitride (SiNx) and silicon oxide (SiOx). The remaining layers of the buffer layer 705, the first insulating layer 710, the second insulating layer 720, and the third insulating layer 735 may be formed of the other of silicon nitride (SiNx) and silicon oxide (SiOx). For example, the uppermost layer of the buffer layer 705, which contacts with the first insulating layer 710, is formed of silicon nitride (SiNx), and the remaining layers of the buffer layer 705, the first insulating layer 710, the second insulating layer 720, and the third insulating layer 735 may be formed of silicon oxide (SiOx), but are not limited thereto.

The gate electrode 725 is formed on the second insulating layer 720 and may overlap with the channel region of the semiconductor layer 715 with the second insulating layer 720 placed therebetween. The gate electrode 725 may be formed of a first conductive material forming a single-layer or a multi-layer made of any one of magnesium (Mg), molybdenum (Mo), aluminum (Al), chromium (Cr), gold (Au), titanium (Ti), nickel (Ni), neodymium (Nd), and copper (Cu) or an alloy thereof. However, the gate electrode is not limited thereto.

The source electrode 740 may be connected to the source region of the semiconductor layer 715 that is exposed through a contact hole passing through the second insulating layer 720 and the third insulating layer 735. The drain electrode 740 faces the source electrode 740 and may be connected to the drain region of the semiconductor layer 715 through a contact hole passing through the second insulating layer 720 and the third insulating layer 735. These source and drain electrodes 740 may be formed of a second conductive material forming a single-layer or a multi-layer made of any one of magnesium (Mg), molybdenum (Mo), aluminum (Al), chromium (Cr), gold (Au), titanium (Ti), nickel (Ni), neodymium (Nd), and copper (Cu) or an alloy of two or more thereof. However, the source and drain electrodes are not limited thereto.

A connection electrode 755 may be disposed between a first intermediate layer 750 and a second intermediate layer 760. The connection electrode 755 may be exposed through a connection electrode contact hole 156 passing through a protective layer 745 and the first intermediate layer 750 and may be connected to the drain electrode 740. The connection electrode 755 may be made of a material having a low resistivity in the same manner as or a similar manner to the drain electrode 740, but is not limited thereto.

Referring to FIG. 23, the light emitting device (OLED) including a light emitting layer 772 may be disposed on the second intermediate layer 760 and a bank layer 765. The light emitting device OLED may include an anode electrode 771, at least one light emitting layer 772 formed on the anode electrode 771, and a cathode electrode 773 formed on the light emitting layer 772.

The anode electrode 771 may be disposed on the first intermediate layer 750 through a contact hole passing through the second intermediate layer 760 and may be electrically connected to the connection electrode 755 exposed upward from the second intermediate layer 760.

The anode electrode 771 of each pixel is formed to be exposed by the bank layer 765. The bank layer 765 may be formed of an opaque material (e.g., black) to prevent optical interference between adjacent pixels. In this case, the bank layer 765 may include a light-shielding material made of at least one of a color pigment, an organic black pigment, and a carbon pigment, but is not limited thereto.

Referring to FIG. 23, at least one light emitting layer 772 may be formed on the anode electrode 771 of a light emitting region provided by the bank layer 765. The at least one light emitting layer 772 may include a hole transport layer, a hole injection layer, a hole blocking layer, the light emitting layer 772, an electron injection layer, an electron blocking layer, and an electron transport layer on the anode electrode 771, and may be formed by stacking them in a sequential order or in a reverse order according to a light emission direction. In addition, the light emitting layer 772 may include first and second light emitting stacks facing each other with a charge generation layer interposed therebetween. In this case, the light emitting layer 772 of one of the first and second light emitting stacks generates blue light, and the other light emitting layer 772 of the other of the first and second light emitting stacks generates yellow-green light. Accordingly, white light may be generated through the first and second light emitting stacks. Since the white light generated from the light emitting stack is incident on a color filter located above or below the light emitting layer 772, a color image may be implemented. As another example, the color image may be implemented by generating color light corresponding to each pixel in each light emitting layer 772 without a separate color filter. For example, the light emitting layer 772 of the red pixel may generate red light, the light emitting layer 772 of the green pixel may generate green light, and the light emitting layer 772 of the blue pixel may generate blue light.

Referring to FIG. 23, the cathode electrode 773 is formed to face the anode electrode 771 with the light emitting layer 772 interposed therebetween and may receive the high potential driving voltage EVDD.

An encapsulation layer 780 may prevent external moisture or oxygen from penetrating the light emitting device (OLED) that is vulnerable to the external moisture or oxygen. To this end, the encapsulation layer 780 may include an inorganic encapsulation layer composed of at least one layer and an organic encapsulation layer composed of at least one layer, but is not limited thereto. In the present disclosure, the structure of the encapsulation layer 780 in which a first encapsulation layer 781, a second encapsulation layer 782, and a third encapsulation layer 783 are sequentially stacked will be taken as an example.

The first encapsulation layer 781 is formed on the substrate 701 on which the cathode electrode 773 is formed. The third encapsulation layer 783 is formed on the substrate 701 on which the second encapsulation layer 782 is formed, and may be formed to surround the top, bottom and side surfaces of the second encapsulation layer 782, together with the first encapsulation layer 781. The first encapsulation layer 781 and the third encapsulation layer 783 may minimize or prevent the penetration of external moisture or oxygen into the light emitting device (OLED). The first encapsulation layer 781 and the third encapsulation layer 783 may be made of an inorganic insulating material that may be deposited at low temperature such as silicon nitride (SiNx), silicon oxide (SiOx), silicon oxynitride (SiON), and aluminum oxide (Al2O3). Since the first encapsulation layer 781 and the third encapsulation layer 783 are deposited in a low-temperature atmosphere, it is possible to prevent the light emitting device (OLED) vulnerable to a high-temperature atmosphere from being damaged during the deposition process of the first encapsulation layer 781 and the third encapsulation layer 783.

The second encapsulation layer 782 may serve as a buffer which reduces stress between the respective layers due to bending of the display device and may flatten a step difference between the respective layers. The second encapsulation layer 782 is formed of non-photosensitive organic insulating materials such as an acrylic resin, an epoxy resin, a phenolic resin, a polyamide resin, a polyimide resin, and polyethylene and silicon oxycarbon (SiOC) or photosensitive organic insulating material such as photoacrylic on the substrate 701 on which the first encapsulation layer 781 is formed, but not limited thereto. When the second encapsulation layer 782 is formed by an inkjet method, a dam DAM may be disposed to prevent the liquid second encapsulation layer 782 from diffusing to the edge of the substrate 701. The dam DAM may be disposed closer to the edge of the substrate 701 than the second encapsulation layer 782. Due to the dam DAM, it is possible to prevent the second encapsulation layer 782 from diffusing to a pad area where a conductive pad which is disposed on the outermost edge of the substrate 701 is disposed.

The dam DAM is designed to prevent the diffusion of the second encapsulation layer 782. However, when the second encapsulation layer 782 is formed to exceed the height of the dam DAM during the process, the second encapsulation layer 782 that is an organic layer may be exposed to the outside. Therefore, this may make it easier for moisture or the like to penetrate the light emitting element. Accordingly, to prevent this problem, at least ten dams DAM may be formed repeatedly.

Referring to FIG. 23, the dam DAM may be disposed on the protective layer 745 of the non-display area NA.

Also, the dam DAM may be formed simultaneously with the first intermediate layer 750 and the second intermediate layer 760. The lower layer of the dam DAM is formed together with the formation of the first intermediate layer 750. The upper layer of the dam DAM is formed together with the formation of the second intermediate layer 760. Therefore, the dam DAM may be formed in a double stacked structure.

Accordingly, the dam DAM may be made of the same material as the first intermediate layer 750 and the second intermediate layer 760, but is not limited thereto.

Referring to FIG. 23, the dam DAM may be formed to overlap a low potential driving power line VSS. For example, in the non-display area NA, the low potential driving power line VSS may be formed in a layer under an area where the dam DAM is located.

The low potential driving power line VSS and a gate driver GD configured in the form of a Gate-In-Panel (GIP) is formed in a shape surrounding the outer portion of the display panel. The low potential driving power supply line VSS may be located more outside than the gate driver GD. In addition, the low potential driving power line VSS may be connected to the anode electrode 771 and apply a common voltage. The gate driver GD is simply shown in plan and cross-sectional views, but may be configured by using a thin film transistor TFT having the same structure as that of the thin film transistor TFT of the display area AA.

Referring to FIG. 23, the low potential driving power line VSS is disposed more outside than the gate driver GD. The low potential driving power line VSS is disposed more outside than the gate driver GD and surrounds the display area AA. The low potential driving power line VSS may be made of the same material as those of the source and drain electrodes 740 of the thin film transistor TFT, but is not limited thereto. For example, the low potential driving power line VSS may be made of the same material as that of the gate electrode 725.

Also, the low potential driving power line VSS may be electrically connected to the anode electrode 771. The low potential driving power line VSS may supply the low potential driving voltage EVSS to the plurality of pixels in the display area AA.

A touch layer 790 may be disposed on the encapsulation layer 780. A touch buffer layer 791 of the touch layer 790 may be located between touch sensor metal and the cathode electrode 773 of the light emitting device (OLED). The touch sensor metal includes touch electrode connection lines 792 and 794 and touch electrodes 795 and 796.

The touch buffer layer 791 may prevent a chemical solution (developing solution or etching solution, etc.) used in the manufacturing process of the touch sensor metal which is disposed on the touch buffer layer 791 or moisture from the outside, etc., from penetrating the light emitting layer 772 including organic materials. Accordingly, the touch buffer layer 791 may prevent damage to the light emitting layer 772 which is vulnerable to chemical solutions or moisture.

The touch buffer layer 791 is formed of an organic material which may be formed at a certain temperature (e. g., 100° C. or less) and has a low dielectric constant of 1 to 3 to prevent damage to the light emitting layer 772 including organic materials vulnerable to high temperatures. For example, the touch buffer layer 791 may be formed of an acryl-based, epoxy-based, or siloxane-based material. The touch buffer layer 791 which is formed of an organic insulating material and has a flattening performance may prevent the encapsulation layer 780 from being damaged due to bending of the organic light emitting display device and prevent the touch sensor metal formed on the touch buffer layer 791 from being broken.

According to a mutual-capacitance-based touch sensor structure, the touch electrodes 795 and 796 may be disposed on the touch buffer layer 791, and the touch electrodes 795 and 796 may be disposed to cross each other.

The touch electrode connection lines 792 and 794 may electrically connect the touch electrodes 795 and 796 to each other. The touch electrode connection lines 792 and 794 and the touch electrodes 795 and 796 may be positioned on different layers with the touch insulating layer 793 interposed therebetween.

The touch electrode connection lines 792 and 794 are arranged to overlap the bank layer 765, so that an aperture ratio may be prevented from being reduced.

Meanwhile, in the touch electrodes 795 and 796, a portion of the touch electrode connection line 792 may pass through the top and side surface of the encapsulation layer 780 and the top and side surface of the dam DAM and may be electrically connected to a touch driving circuit (not shown) through a touch pad 198.

The portion of the touch electrode connection line 792 may receive a touch driving signal from the touch driving circuit and may transmit the touch driving signal to the touch electrodes 795 and 796, and may transfer a touch sensing signal from the touch electrodes 795 and 796 to the touch driving circuit.

A touch protective layer 797 may be disposed on the touch electrodes 795 and 796. In the drawing, the touch protective layer 797 is shown as being disposed only on the touch electrodes 795 and 796, but is not limited thereto. The touch protective layer 797 may extend to the front and rear of the dam DAM and be disposed on the touch electrode connection line 792.

Also, a color filter (not shown) may be further disposed on the encapsulation layer 780. The color filter may be positioned on the touch layer 790 or between the encapsulation layer 780 and the touch layer 790.

The above-described stacked structures or components on the cross-sectional view of the display device of FIG. 23 may be applied to the display device 1 according to FIGS. 1 to 11. Since the stacked structures or components of the display device of FIG. 23 belong to the same technical field as the display device 1 of FIGS. 1 to 11, it is obvious that they are in combination with each other. That is, the stacked structures or components on the cross-sectional view of the non-display area NA of the display device of FIG. 23 may be applied to the non-display area NDA of the display device 1 of FIG. 7, and the stacked structures or components on the cross-sectional view of the display area AA may be applied to the display area DA of the display device 1 of FIGS. 7 and 9.

While the aspect of the present disclosure has been described with reference to the accompanying drawings, it may be understood by those skilled in the art that the present disclosure may be embodied in other specific forms without departing from its spirit or essential characteristics. Therefore, the foregoing aspects and advantages are merely exemplary and are not to be construed as limiting the present disclosure. The present teaching may be readily applied to other types of apparatuses. The description of the foregoing aspects is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A display device comprising:
   a substrate comprising a main region,
   a bending region which is bent from the main region in a thickness direction of the substrate,
   a sub-region which is connected to the bending region and faces the main region; and
   a plurality of wirings configured to extend from the sub-region of the substrate through the bending region of the substrate to the main region of the substrate,
   wherein the plurality of wirings includes:
      a first wiring to which a first voltage is applied;
      a second wiring to which a second voltage is applied; and
      a dummy wiring which receives a third voltage and is between the first wiring and the second wiring,
      wherein the second voltage is higher than the first voltage, and the third voltage is lower than the first voltage, and
      wherein the main region of the substrate, the bending region of the substrate, and the sub-region of the substrate are formed integrally.

2. The display device of claim 1, further comprising a data driver disposed in the sub-region,
   wherein the first wiring and the second wiring are connected to the data driver.

3. The display device of claim 2, wherein the dummy wiring is connected to the data driver.

4. The display device of claim 2, wherein the main region comprises a display area including a plurality of pixels, and a non-display area around the display area.

5. The display device of claim 4, further comprising a gate driver disposed in the non-display area.

6. The display device of claim 5, wherein the first wiring is connected to the gate driver.

7. The display device of claim 6, wherein the second wiring is located outside the gate driver in a planar manner.

8. The display device of claim 1, wherein a width of the bending region in a first direction is less than a width of the main region in the first direction and a width of the sub-region in the first direction, respectively.

9. The display device of claim 1, further comprising a first planarization layer disposed in the bending region between the first wiring, the second wiring, and the dummy wiring and the substrate, and a second planarization layer disposed on the first wiring, the second wiring, and the dummy wiring.

10. The display device of claim 1, wherein the substrate comprises polyimide.

11. A display device comprising:
    a main region;
    a bending region which is bent from the main region in a thickness direction of a substrate;
    a sub-region which is connected to the bending region and faces the main region; and
    a plurality of wirings configured to extend from the sub-region through the bending region to the main region,
    wherein the plurality of wirings includes:
       a first wiring to which a first voltage is applied;
       a second wiring to which a second voltage is applied; and
       a dummy wiring which receives a third voltage and is between the first wiring and the second wiring,
       wherein the substrate comprises a first substrate portion overlapping the first wiring, a second substrate portion overlapping the second wiring, and a third substrate portion overlapping the dummy wiring, and
       wherein physical properties of the first substrate portion, the second substrate portion, and the third substrate portion are different from one another, and
       wherein a pH of the third substrate portion is higher than a pH of the first substrate portion and a pH of the second substrate portion.

12. The display device of claim 11, wherein the pH of the first substrate portion is higher than the pH of the second substrate portion.

13. The display device of claim 11, wherein the second voltage is higher than the first voltage, and the third voltage is lower than the first voltage.

14. The display device of claim 11, wherein a surface of the dummy wiring comprises a crack.

15. The display device of claim 14, wherein each of the first wiring and the second wiring comprise a crack, and
    wherein a depth of the crack of the dummy wiring is greater than a depth of the crack of the first wiring and a depth of the crack of the second wiring, respectively.

16. The display device of claim 15, wherein the depth of the crack of the first wiring is greater than the depth of the crack of the second wiring.

17. A display device comprising:
a main region;
a bending region which is bent from the main region in a thickness direction of a substrate;
a sub-region which is connected to the bending region and faces the main region; and
a plurality of wirings configured to extend from the sub-region through the bending region to the main region,
wherein the plurality of wirings includes:
a first wiring to which a first voltage is applied;
a second wiring to which a second voltage is applied; and
a dummy wiring which receives a third voltage and is between the first wiring and the second wiring,
wherein the substrate comprises a first substrate portion overlapping the first wiring, a second substrate portion overlapping the second wiring, and a third substrate portion overlapping the dummy wiring, and
wherein physical properties of the first substrate portion, the second substrate portion, and the third substrate portion are different from one another, and
wherein a roughness of a surface of the third substrate portion is larger than a roughness of a surface of the first substrate portion and a roughness of a surface of the second substrate portion, respectively.

18. The display device of claim 17, wherein the roughness of the surface of the first substrate portion is larger than the roughness of the surface of the second substrate portion.

19. A display device comprising:
a main region;
a bending region which is bent from the main region in a thickness direction of a substrate;
a sub-region which is connected to the bending region and faces the main region; and
a plurality of wirings configured to extend from the sub-region through the bending region to the main region,
wherein the plurality of wirings includes:
a first wiring to which a first voltage is applied;
a second wiring to which a second voltage is applied; and
a dummy wiring which receives a third voltage and is between the first wiring and the second wiring,
wherein the substrate comprises a lower substrate and an upper substrate disposed over the lower substrate,
wherein the lower substrate comprises a first lower substrate portion overlapping the first wiring, a second lower substrate portion overlapping the second wiring, and a third lower substrate portion overlapping the dummy wiring, and the physical properties of the first lower substrate portion, the second lower substrate portion, and the third lower substrate portion are different from one another, and
wherein the upper substrate comprises a first upper substrate portion overlapping the first wiring, a second upper substrate portion overlapping the second wiring, and a third upper substrate portion overlapping the dummy wiring, and the physical properties of the first upper substrate portion, the second upper substrate portion, and the third upper substrate portion are different from one another.

* * * * *